(12) United States Patent
Adabi et al.

(10) Patent No.: US 10,200,067 B1
(45) Date of Patent: Feb. 5, 2019

(54) RADIO FREQUENCY TRANSCEIVER FRONT-END SYSTEMS AND METHODS

(71) Applicant: Apple Inc., Cupertino, CA (US)

(72) Inventors: Ehsan Adabi, Mountainview, CA (US); Albert C. Jerng, Woodside, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/875,782

(22) Filed: Jan. 19, 2018

Related U.S. Application Data

(60) Provisional application No. 62/565,334, filed on Sep. 29, 2017.

(51) Int. Cl.
| | |
|---|---|
| *H04B 1/40* | (2015.01) |
| *H04B 1/00* | (2006.01) |
| *H04B 1/403* | (2015.01) |
| *H03F 3/181* | (2006.01) |
| *H04B 15/06* | (2006.01) |

(52) U.S. Cl.
CPC ............ *H04B 1/0014* (2013.01); *H03F 3/181* (2013.01); *H04B 1/406* (2013.01); *H04B 15/06* (2013.01); *H03F 2200/294* (2013.01)

(58) Field of Classification Search
CPC ..................................................... H04B 1/406
See application file for complete search history.

(56) References Cited

U.S. PATENT DOCUMENTS

| | | |
|---|---|---|
| 9,232,443 B2 | 1/2016 | Fu et al. |
| 2016/0020752 A1 | 1/2016 | Vahid Far et al. |

OTHER PUBLICATIONS

M. Naimul Hasan, et al.; "Tunable Blocker-Tolerant On-chip Radio Frequency Front-end Filter with Dual Adaptive Transmission Zeros for Software Defined Radio Applications", IEEE Transactions on Microwave Theory and Techniques, vol. 64 Issue 12, Nov. 18, 2016; pp. 4419-4433.

*Primary Examiner* — Ross Varndell
(74) *Attorney, Agent, or Firm* — Fletcher Yoder PC

(57) ABSTRACT

Systems and methods for improving operational efficiency of a radio frequency system, which includes a low noise amplifier coupled to an antenna that generates an analog electrical signal based on received electromagnetic waves. The low noise amplifier includes a positive input transistor with a first drain, a negative input transistor with a second drain, a first data branch coupled between the first and second drains, and a second data branch coupled between the first drain and second drains. The first data branch supplies a first current modulated signal generated based on the analog electrical signal when the radio frequency system expects the received electromagnetic waves to include data indicated using a first communication protocol. The second data branch supplies a second current modulated signal generated based on the analog electrical signal when the radio frequency system expects the received electromagnetic waves to include data indicated using a second communication protocol.

20 Claims, 14 Drawing Sheets

* # RADIO FREQUENCY TRANSCEIVER FRONT-END SYSTEMS AND METHODS

CROSS-REFERENCE TO RELATED APPLICATIONS

This application is a Non-Provisional Application claiming priority to U.S. Provisional Patent Application No. 62/565,334, entitled "RADIO FREQUENCY TRANSCEIVER FRONT-END SYSTEMS AND METHODS" and filed Sep. 29, 2017, which is herein incorporated by reference in its entirety for all purposes.

BACKGROUND

The present disclosure generally relates to radio frequency systems and, more particularly, to transceiver front-end circuitry that may be implemented in a radio frequency system.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic devices often include a radio frequency system to facilitate wireless data communication with another electronic device and/or a communication network, such as a Wi-Fi network. Generally, a radio frequency system may include a transceiver communicatively coupled to an antenna. For example, to wirelessly transmit data, the transceiver may output an analog representation of the data as an analog electrical signal and the antenna may modulate electromagnetic (e.g., radio) waves based at least in part on the analog electrical signal. Additionally or alternatively, the antenna may output an analog representation of received electromagnetic waves as an analog electrical signal and the transceiver may process the analog electrical signal to facilitate identifying relevant data, for example, as a digital electrical signal to facilitate subsequent processing.

Unfortunately, in addition to relevant data, electromagnetic waves received by an antenna often includes electromagnetic interference. Thus, to facilitate identifying relevant data, the transceiver may filter the analog electrical signal output from the antenna, for example, such that frequencies outside a range of targeted (e.g., assigned or allocated) transmission frequencies are attenuated based at least in part on distance from the targeted transmission frequencies. Nevertheless, as magnitude of electromagnetic interference increases and/or distance from the targeted frequencies decreases, likelihood of provided filtering becoming insufficient may increases, thereby decreasing communication reliability of the radio frequency system.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure generally relates to radio frequency systems, which may be implemented in electronic devices to facilitate wireless data communication. More specifically, the present disclosure provides techniques that facilitate improving operational efficiency of a radio frequency system, for example, by enabling the radio frequency system to concurrently (e.g., simultaneously) communicate with multiple communication networks that utilize different communication protocols. In some embodiments, a radio frequency system may be implemented with multiple antennas to enable the radio frequency system to wirelessly transmit data to a first (e.g., LTE) network while concurrently receiving data wirelessly from a second (e.g., 802.11x) network. Additionally, in some embodiments, a radio frequency system may by implemented to enable processing of data concurrently received from multiple different communication networks.

To facilitate processing of concurrently received data, in some embodiments, a radio frequency system may include transceiver front-end circuitry that selectively routes the received data through one or more of multiple data paths. For example, to support concurrent Wi-Fi and Bluetooth reception, the radio frequency system may include a low noise amplifier (LNA) electrically coupled to a Wi-Fi data path and a Bluetooth data path. In some embodiments, the low noise amplifier may be implemented to operate in a current mode such that it generates a current modulated radio frequency signal (e.g., varying current and substantially constant voltage) based at least in part on voltage of an analog electrical radio frequency signal output from an antenna.

Additionally, to facilitate routing data indicated by a current modulated radio frequency signal into appropriate data paths, the low noise amplifier may include a data branch corresponding with each supported communication protocol. In some embodiments, each data branch in the low noise amplifier may include cascode transistors, which are each implemented to operate in its saturated region. Thus, in some embodiments, a controller may calibrate the low noise amplifier by determining gate voltage supplied to each cascode transistor based at least in part on whether the radio frequency system is targeting (e.g., expects to receive) a corresponding communication protocol (e.g., signal type).

For example, when a first (e.g., Wi-Fi) communication protocol is targeted, the controller may control gate voltages such that each cascode transistors on a first data branch corresponding with the first communication protocol permits current flow through its channel. Similarly, when a second (e.g., Bluetooth) communication protocol is targeted, the controller may control gate voltages such that each cascode transistors on a second data branch corresponding with the second communication protocol permits current flow through its channel. Moreover, when both the first communication protocol and the second communication protocol are targeted, a first portion (e.g., half) of the current modulated radio frequency signal may be routed through the first data branch and a second portion (e.g., half) of the current modulated radio frequency signal may be routed through the second data branch.

To facilitate subsequent processing, each data path in the transceiver front-end circuitry may include a mixer coupled downstream relative to the low noise amplifier, for example, to convert an input analog electrical signals from a radio frequency to a processing (e.g., intermediate or baseband) frequency expected by subsequent circuitry. Additionally, to facilitate identifying target data for subsequent processing, each data path in the transceiver front-end circuitry may include one or more trans-impedance amplifier (TIAs) coupled downstream relative to its mixer, for example, to generate voltage modulated signals based at least in part on corresponding input current modulated signals.

In some embodiments, a trans-impedance amplifier may be implemented by a differential voltage amplifier and one or more filters. Additionally, in some embodiments, the voltage amplifier may include a differential amplifier core and direct current offset canceling circuitry, for example, coupled in parallel with a positive differential transistor pair in the differential amplifier core. By controlling gate voltages applied in the direct current offset canceling circuitry, mismatches between a positive direct current offset and a negative direct current offset introduced by the differential amplifier core may be compensated for, thereby reducing likelihood such mismatches affecting accuracy of target data identification.

Additionally, to facilitate identifying the target data from electromagnetic interference, the trans-impedance amplifier may include a first-order filter, for example, implemented by a feedback resistor and a feedback capacitor coupled between its input node and its output node. In some embodiments, resistance of the feedback resistor and/or capacitance of the feedback capacitor may be adaptively adjustable (e.g., tunable), for example, to control gain applied by the differential voltage amplifier, first-order filter parameters (e.g., passband and/or cutoff frequency), and/or power consumption.

Additionally, in some embodiments, a trans-impedance amplifier may be implemented to selectively provide higher-order filtering. For example, a trans-impedance amplifier may include a second-order filter and a switching device electrically coupled between its input node and its output node. Since the second-order filter may consume significant electrical power, in some embodiments, the second-order filter may be selectively connected via the switching device to facilitate reducing power consumption, for example, such that the second-order filter is connected when a controller determines that corresponding electromagnetic waves were received while the radio frequency system was concurrently transmitting.

To facilitate providing second-order filtering, a trans-impedance amplifier may additionally or alternatively include an input capacitor electrically coupled to its input node and an output capacitor electrically coupled to its output node. In some embodiments, capacitance of the input capacitor and/or capacitance of the output capacitor may be adaptively adjustable (e.g., tunable). For example, to produce a second-order response in its transfer function, a controller may output control commands (e.g., signals) that instruct the trans-impedance amplifier to adjust capacitance of the input capacitor. Additionally, to move a first pole and/or a second pole in its transfer function, the controller may output control commands (e.g., signals) that instruct the trans-impedance amplifier to adjust capacitance of the output capacitor. In other words, by implementing in this manner, a trans-impedance amplifier may provide adaptively tunable filtering that facilitates isolating target data, for example, from electromagnetic interference and/or irrelevant (e.g., untargeted) data resulting from concurrent wireless data communication with multiple different communication networks.

BRIEF DESCRIPTION OF THE DRAWINGS

Various aspects of this disclosure may be better understood upon reading the following detailed description and upon reference to the drawings in which.

DETAILED DESCRIPTION

Figure 1:
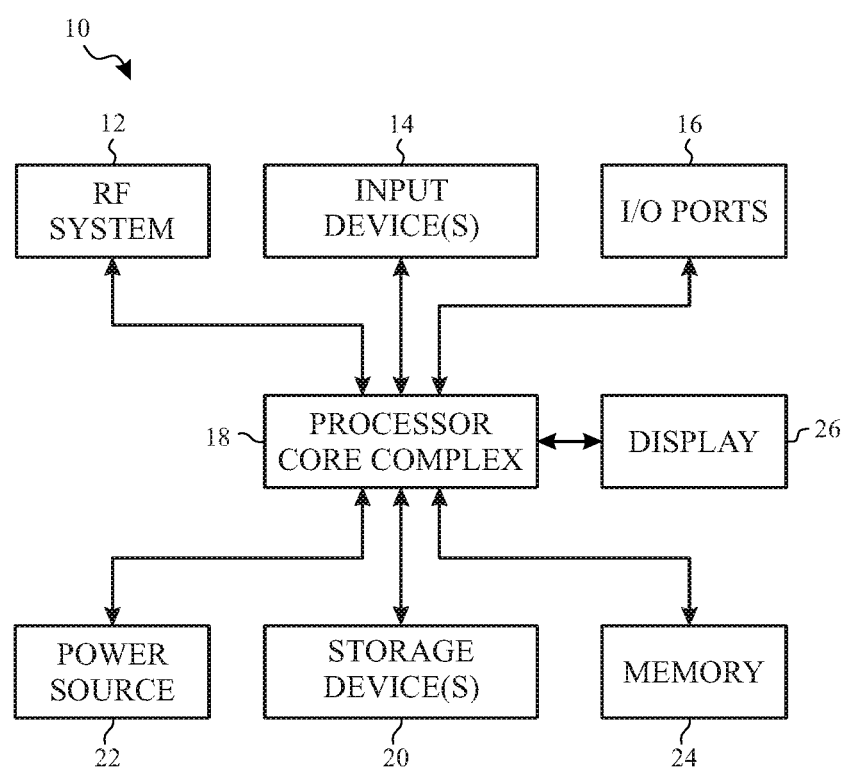
FIG. 1 is a block diagram of an electronic device including a radio frequency system, in accordance with an embodiment.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure relates to radio frequency systems, which may be implemented in electronic devices to facilitate wireless data communication. For example, a radio frequency system may facilitate wireless data communication between an electronic device and a personal area network (PAN), such as a Bluetooth network. Additionally or alternatively, a radio frequency system may facilitate wireless data communication between an electronic device and a local area network (LAN), such as a Wi-Fi network. Additionally or alternatively, a radio frequency system may facilitate wireless data communication between an electronic device and a wide area network (WAN), such as a cellular (e.g., LTE) network. Since they often utilize different communication protocols, to enable wireless communication across multiple different types of communication networks, a radio frequency system may be implemented to be compatible with multiple different communication protocols.

Nevertheless, regardless of supported communication protocols, operation of radio frequency systems may be generally similar. For example, to wirelessly transmit data, processing (e.g., transceiver and/or baseband) circuitry in a radio frequency system may generate an analog representation of the data as an analog electrical signal and an antenna may modulate electromagnetic (e.g., radio) waves based at least in part on the analog electrical signal to indicate the data. Additionally or alternatively, the antenna may output an analog electrical signal based at least in part on received electromagnetic waves and the processing circuitry may generate a digital representation of data indicated by the analog electrical signal as a digital electrical signal.

The present disclosure provides techniques that facilitate improving operational efficiency of a radio frequency system, for example, by enabling the radio frequency system to concurrently (e.g., simultaneously) communicate with multiple different communication networks. To facilitate concurrent communication, in some embodiments, a radio frequency system may be implemented with multiple antennas. For example, the radio frequency system may include a first antenna implemented to communicate with a long-term evolution (LTE) network and a second antenna implemented to communicate with an 802.11x network, such as a Bluetooth network or a Wi-Fi network.

In fact, implementing the radio frequency system with multiple antennas may enable the electronic device to wirelessly transmit data to a first (e.g., LTE) network while concurrently receiving data wirelessly from a second (e.g., 802.11x) network or vice versa. At least in some instances, this may facilitate improving communicating efficiency of the radio frequency system and, thus, an electronic device in which the radio frequency system is implemented, for example, by enabling alternation between LTE transmission duty cycles and 802.11x reception duty cycles to be obviated. However, implementing an antenna in a radio frequency system may also affect its implementation associated cost. For example, increasing number of antennas implemented in a radio frequency system may result in an increase in size (e.g., physical footprint) of the radio frequency system, component count in the radio frequency system, and/or manufacturing steps for implementing the radio frequency system.

To facilitate reducing implementation associated cost, in some embodiments, a radio frequency system may include one antenna implemented to be compatible with multiple different types of communication networks. Continuing with the above example, the second antenna may be implemented to be compatible with both Bluetooth networks and Wi-Fi networks. In fact, in some embodiments, implementing an antenna in this manner may enable the electronic device to concurrently receive data from multiple different communication networks. For example, when a Bluetooth signal and a Wi-Fi signal are concurrently received, the second antenna may output an analog electrical signal modulated to provide a combined analog representation of the Bluetooth signal and the Wi-Fi signal.

To facilitate processing of concurrently received data, in some embodiments, a radio frequency system may include transceiver (e.g., receiver, transmitter, or both) front-end circuitry that selectively routes the received data through one or more of multiple data paths. For example, the radio frequency system may include a low noise amplifier (LNA) electrically coupled between an input node (e.g., port or pin) and a Wi-Fi data path and electrically coupled between the input node and a Bluetooth data path. In some embodiments, the low noise amplifier may be implemented to operate in a current mode. In other words, the low noise amplifier may generate a current modulated radio frequency signal (e.g., varying current and substantially constant voltage) based at least in part on voltage of an analog electrical radio frequency signal output from an antenna due to received electromagnetic waves.

To facilitate producing a current modulated radio frequency signal, in some embodiments, a low noise amplifier may include a positive (e.g., PMOS) input transistor implemented such that its gate is electrically coupled to an input node of the low noise amplifier and its source is electrically coupled to a (e.g., constant one volt direct current) power source as well as a negative (e.g., NMOS) input transistor implemented such that its gate is electrically coupled to the input node of the low noise amplifier and its source is electrically coupled to ground. Additionally, the positive input transistor and the negative input transistor may each be implemented to operate in its linear region. For example, the positive input transistor may vary its channel width and, thus, current flow through the positive input transistor linearly with positive voltage of an input signal. Additionally, the negative input transistor may vary its channel width and, thus, current flow through the negative input transistor linearly with negative voltage of the input signal. Thus, when an analog electrical radio frequency signal is received from an antenna, the low noise amplifier may produce a current modulated radio frequency signal that varies relatively linearly with voltage of the analog electrical radio frequency signal.

Additionally, to facilitate routing received data into appropriate data paths, the low noise amplifier may include a data branch corresponding with each supported communication protocol. For example, when implemented to wirelessly communicate with Wi-Fi networks and Bluetooth networks, the low noise amplifier may include a Wi-Fi data branch coupled to a Wi-Fi data path through the transceiver front-end circuitry and a Bluetooth branch coupled to a Bluetooth data path through the transceiver front-end circuitry. To facilitate routing data indicated by a current modulated radio frequency signal, in some embodiments, each data branch in the low noise amplifier may include cascode transistors, which are each implemented to operate in its saturated region. For example, the cascode transistors implemented on a data branch may include a p-channel metal-oxide semiconductor (PMOS) transistor electrically coupled between the positive input transistor and a corresponding output node as well as an n-channel metal-oxide semiconductor (NMOS) transistor electrically coupled between the negative input transistor and the corresponding output node.

In other words, current flow through each data branch and, thus, each corresponding data path may be controlled by gate voltage supplied to the cascode transistors. Thus, in some embodiments, a low noise amplifier may be calibrated by adjusting gate voltages applied to one or more of the cascode transistors. For example, a controller may calibrate the low noise amplifier by determining gate voltage supplied to each cascode transistor based at least in part on whether the radio frequency system is targeting (e.g., expects to receive) a corresponding signal type.

As an illustrative example, when Wi-Fi signals are targeted, the controller may control gate voltages such that each cascode transistors on the Wi-Fi data branch permits current flow through its channel. In this manner, at least a portion of current output from the input transistors may be routed through the Wi-Fi branch of the low noise amplifier and, thus, the Wi-Fi data path through the transceiver front-end circuitry. Similarly, when Bluetooth signals are targeted, the controller may control gate voltages such that each cascode transistors on the Bluetooth branch permits current flow through its channel. In this manner, at least a portion of current output from the input transistors may be routed through the Bluetooth branch of the low noise amplifier and, thus, a Bluetooth data path through the transceiver front-end circuitry. In other words, implementing a current mode low noise amplifier may facilitate processing of concurrently received Wi-Fi signals and Bluetooth signals by enabling a first portion (e.g., half) of the current output from the input transistors to be routed through the Wi-Fi branch and a second portion (e.g., half) of the current output from the input transistors to be routed through the Bluetooth branch.

To facilitate subsequent processing, in some embodiments, transceiver front-end circuitry may include one or more mixers coupled downstream relative to its low noise amplifier, for example, to convert an input analog electrical signals from a radio frequency to a processing (e.g., intermediate or baseband) frequency expected by subsequent circuitry. To facilitate processing of concurrently received data indicated using different communication protocols, in some embodiments, a mixer may be implemented on each data path in the transceiver front-end circuitry. For example, to facilitate processing of concurrently received Wi-Fi data and Bluetooth data, the transceiver front-end circuitry may include a first mixer implemented on the Wi-Fi data path and a second mixer implemented on the Bluetooth data path.

Furthermore, in some embodiments, each mixer may be a passive mixer. For example, the mixer may include a mixer transistor electrically coupled between an input node of the mixer and an output node of the mixer, which is implemented to operate in its saturated region. Thus, by supplying a local oscillator signal to its gate, the mixer transistor may up convert or down covert current modulation frequency on an input analog electrical signal. For example, when an analog electrical radio frequency signal is input, the mixer transistor may output current modulated at a processing frequency expected to be received by downstream circuitry, such as an analog-to-digital (ADC) converter and/or digital processing circuitry.

Moreover, in some embodiments, a mixer may include multiple mixer transistors to facilitate identifying multiple different components from an input analog electrical signal. For example, the mixer may include four mixer transistors each implemented on a corresponding component path through mixer. By supplying ninety degree phase-shifted local oscillator signals to the mixer transistor gates, the mixer may output a positive in-phase current modulated processing frequency signal, a negative in-phase current modulated processing frequency signal, a positive quadrature current modulated processing frequency signal, and a negative quadrature current modulated processing frequency signal.

Since subsequent processing circuitry may be implemented to process voltage modulated signals, in some embodiments, a radio frequency system may include one or more trans-impedance amplifier (TIAs), for example, to convert a current modulated processing frequency signal to a voltage modulated processing frequency signal. To facilitate processing of concurrently received data indicated using different communication protocols, in some embodiments, the radio frequency system may include a trans-impedance amplifier implemented on each data path in the transceiver front-end circuitry. For example, to facilitate processing of concurrently received Wi-Fi data and Bluetooth data, the transceiver front-end circuitry may include a first trans-impedance amplifier implemented on the Wi-Fi data path and a second trans-impedance amplifier implemented on the Bluetooth data path. Additionally or alternatively, each data path may include one trans-impedance amplifier coupled to in-phase output nodes of its mixer and another trans-impedance amplifier coupled to quadrature output nodes of its mixer.

Furthermore, in some embodiments, a trans-impedance amplifier may be implemented by a differential voltage amplifier, such as an op-amp, and one or more filters coupled to its input node and/or its output node. For example, the trans-impedance amplifier may include a feedback resistor and a feedback capacitor coupled in parallel between the input node and the output node. In this manner, the trans-impedance amplifier may apply first-order filtering, which attenuates magnitude at frequencies outside a target (e.g., expected, assigned, or allocated) transmission frequency range used to indicate target data proportionally with distance from the targeted transmission frequency range.

In some embodiments, resistance of the feedback resistor and/or capacitance of the feedback capacitor may be adaptively adjustable (e.g., tunable). For example, to adjust gain applied by the differential voltage, a controller may output control commands (e.g., signals) that instruct the trans-impedance amplifier to adjust resistance of the feedback resistor. Additionally or alternatively, to adjust cutoff (e.g., corner) frequency of the first-order filtering, the controller may output control commands (e.g., signals) that instruct the trans-impedance amplifier to adjust resistance of the feedback resistor and/or capacitance of the feedback capacitor.

When magnitude of electromagnetic interference is relatively small and/or location of electromagnetic interface is relatively far from the target transmission frequency range, the first-ordering filtering may be sufficient to attenuate the electromagnetic interference. However, as magnitude increases and/or frequency distance (e.g., difference) decreases, first-order filtering may no longer be sufficient to isolate relevant (e.g., expected, targeted, or intended) data from electromagnetic interference. As such, in some embodiments, a trans-impedance amplifier may be implemented to selectively provide higher-order filtering.

For example, a trans-impedance amplifier may be implemented to apply second-order filtering, which attenuates magnitude at frequencies outside the target transmission frequency range used to indicate target data quadratically with distance from the target transmission frequency range. In some embodiments, a trans-impedance amplifier may include a second-order filter and a switching device electrically coupled between its input node and its output node in parallel with the first-order filter (e.g., feedback resistor and feedback capacitor). Since the second-order filter may consume significant electrical power, in some embodiments, the second-order filter may be selectively connected via the switching device to facilitate reducing power consumption. For example, a controller may output control commands (e.g., signals) that instruct the switching device to connect the second-order filter when magnitude of electromagnetic interference is expected to be greater than a magnitude threshold and/or difference (e.g., distance) between frequency of electromagnetic interference and the target transmission frequency range is expected to be less than a difference threshold.

To facilitate providing second-order filtering, a trans-impedance amplifier may additionally or alternatively include an input capacitor electrically coupled between its input node and ground as well as an output capacitor electrically coupled between its output node and ground. In some embodiments, capacitance of the input capacitor and/or capacitance of the output capacitor may be adaptively adjustable (e.g., tunable). For example, to produce a second-order response in its transfer function, a controller may output control commands (e.g., signals) that instruct the trans-impedance amplifier to adjust capacitance of the input capacitor. Additionally, to move a first pole and/or a second pole in its transfer function, the controller may output control commands (e.g., signals) that instruct the trans-impedance amplifier to adjust capacitance of the output capacitor.

In other words, by implementing in this manner, a trans-impedance amplifier may provide adaptively tunable filtering that facilitates isolating target data, for example, from electromagnetic interference and/or irrelevant (e.g., untargeted) data. Thus, in some embodiments, a controller may control filtering applied by the trans-impedance amplifier based at least in part on target frequency range used to indicate the target data, expected frequency of the electromagnetic interference, and/or expected power of the electromagnetic interference. In fact, by implementing a trans-impedance amplifier in this manner on each data path, transceiver front-end circuitry may facilitate processing of concurrently received data by enabling filtering applied on each data path to be adaptively adjusted based at least in part on corresponding communication protocol.

Moreover, implementing a radio frequency system in this manner may enable providing concurrent wireless transmission and wireless reception with reduced implementation cost. Since outgoing electromagnetic waves may interact with incoming electromagnetic waves, when an electronic device includes multiple antennas, electromagnetically isolating material may be formed between the antennas. However, since the electromagnetic isolation is generally finite, electromagnetic waves transmitted from a first antenna of an electronic device may nevertheless be received by a second antenna of the electronic device and, thus, contribute to electromagnetic interference received by the second antenna.

In fact, when at relatively close frequencies, electromagnetic waves transmitted from the first antenna is often one of the larger sources of electromagnetic interference received by the second antenna. Moreover, due to power of electromagnetic waves decreasing quadratically as transmission distance increases, power of the electromagnetic waves transmitted from the first antenna may be substantially greater than power of electromagnetic waves corresponding with data targeted by the second antenna. In other words, in such instances, magnitude of an interference portion of received electromagnetic waves may be substantially greater than magnitude of a targeted data portion of the received electromagnetic waves.

In addition to enabling concurrent reception of wirelessly transmitted data from multiple communication networks, implementing a low noise amplifier to operate in a current mode may facilitate accounting for large magnitude electromagnetic interference. In particular, by modulating current, the low noise amplifier may reduce likelihood of producing a saturated analog electrical signal at intermediate nodes (e.g., between low noise amplifier and mixer and/or between mixer and trans-impedance amplifier) in the transceiver front-end circuitry, for example, compared to an amplifier implemented to operate in a voltage mode. Moreover, in some embodiments, the transceiver front-end circuitry may include bypass paths around its low noise amplifier, which may be connected to bypass the low noise amplifier when signal power of an analog electrical radio frequency signal output from the antenna is greater than a signal power threshold. At least in some instances, implementing transceiver front-end circuitry in this manner may facilitate reducing implementation associated cost of the transceiver front-end circuitry and, thus, an electronic device in which the transceiver front-end circuitry is implemented, for example, by obviating an additional filter between an antenna and the transceiver front-end circuitry.

To help illustrate, one embodiment of an electronic device 10 including a radio frequency system 12 is shown in FIG. 1. As will be described in more detail below, the electronic device 10 may be any suitable electronic device, such as a computer, a mobile phone, a portable media device, a tablet, a television, a virtual-reality headset, a vehicle dashboard, and the like. Thus, it should be noted that FIG. 1 is merely one example of a particular implementation and is intended to illustrate the types of components that may be present in an electronic device 10.

In the depicted embodiment, the electronic device 10 includes the radio frequency system 12, one or more input devices 14, local memory 24, a processor core complex 18, one or more main memory storage devices 20, a power source 22, one or more input/output ports 16, and an electronic display 26. The various components described in FIG. 1 may include hardware elements (e.g., circuitry), software elements (e.g., a tangible, non-transitory computer-readable medium storing instructions), or a combination of both hardware and software elements. It should be noted that the various depicted components may be combined into fewer components or separated into additional components.

For example, the local memory 24 and a main memory storage device 20 may be included in a single component.

As depicted, the processor core complex 18 is operably coupled with local memory 24 and the main memory storage device 20. Thus, the processor core complex 18 may execute instruction stored in local memory 24 and/or the main memory storage device 20 to perform operations, such as instructing the radio frequency system 12 to communicate with another electronic device and/or a network. As such, the processor core complex 18 may include one or more general purpose microprocessors, one or more application specific processors (ASICs), one or more field programmable logic arrays (FPGAs), or any combination thereof.

In addition to the instructions, the local memory 24 and/or the main memory storage device 20 may store data to be processed by the processor core complex 18. Thus, in some embodiments, the local memory and/or the main memory storage device 20 may include one or more tangible, non-transitory, computer-readable mediums. For example, the local memory 24 may include random access memory (RAM) and the main memory storage device 20 may include read only memory (ROM), rewritable non-volatile memory such as flash memory, hard drives, optical discs, and the like.

As depicted, the processor core complex 18 is also operably coupled with the I/O ports 16. In some embodiments, the I/O ports 16 may enable the electronic device 10 to interface with other electronic devices. For example, a portable storage device may be connected to an I/O port 16, thereby enabling the processor core complex 18 to communicate data with the portable storage device.

Additionally, as depicted, the processor core complex 18 is operably coupled to the power source 22. In some embodiments, the power source 22 may provide power to one or more components in the electronic device 10, such as the processor core complex 18 and/or the radio frequency system 12. Thus, the power source 22 may include any suitable energy source, such as a rechargeable lithium polymer (Li-poly) battery and/or an alternating current (AC) power converter.

Furthermore, as depicted, the processor core complex 18 is operably coupled with the input devices 14. In some embodiments, the input device 14 may facilitate user interaction with the electronic device 10, for example, by receiving user inputs. Thus, the input devices 14 may include a button, a keyboard, a mouse, a trackpad, and/or the like. Additionally, in some embodiments, the input devices 14 may include touch sensing components in the electronic display 26. In such embodiments, the touch sensing components may receive user inputs by detecting occurrence and/or position of an object contacting the surface of the electronic display 26.

In addition to enabling user inputs, the electronic display 26 may display images, such as a graphical user interface (GUI) for an operating system, an application interface, a still image, or video content. As depicted, the electronic display 26 is operably coupled to the processor core complex 18. In this manner, the electronic display 26 may display images based at least in part on image data received from the processor core complex 18.

As depicted, the processor core complex 18 is also operably coupled with the radio frequency system 12. As described above, the radio frequency system 12 may facilitate wirelessly communicating data with another electronic device and/or a communication network. For example, the radio frequency system 12 may enable the electronic device 10 to communicatively couple to a personal area network (PAN), such as a Bluetooth network, a local area network (LAN), such as an 802.11x Wi-Fi network, and/or a wide area network (WAN), such as a 4G or LTE cellular network. In other words, the radio frequency system 12 may enable wirelessly communicating data using various communication protocols.

Even when using different communication protocols, operational principles of radio frequency systems 12 may be generally similar. For example, the radio frequency system 12 may convert a digital electrical signal, which digitally represents data to be transmitted, into an analog electrical signal, thereby generating an analog representation of the data. Additionally, the radio frequency system 12 may use an amplifier device to amplify the analog electrical signal to a target output power, thereby generating an amplified analog electrical signal. Based at least in part on the amplified analog electrical signal, the radio frequency system 12 may modulate electromagnetic waves at a radio frequency, thereby wirelessly transmitting corresponding data via an electromagnetic radio frequency signal.

Additionally or alternatively, the radio frequency system 12 may generate an analog electrical signal modulated based at part on power of received electromagnetic waves, thereby indicating wirelessly received data via an analog electrical radio frequency signal. Since received electromagnetic waves often include electromagnetic interference, the radio frequency system 12 may filter and/or amplify the analog electrical radio frequency signals. Furthermore, to facilitate subsequent processing, the radio frequency system 12 may convert from the radio frequency to a processing (e.g., intermediate or baseband) frequency and/or to a digital electrical signal. Due to similarities in operational principles, the techniques described herein may be applicable to any suitable radio frequency system 12 regardless of communication protocol.

Figure 2:
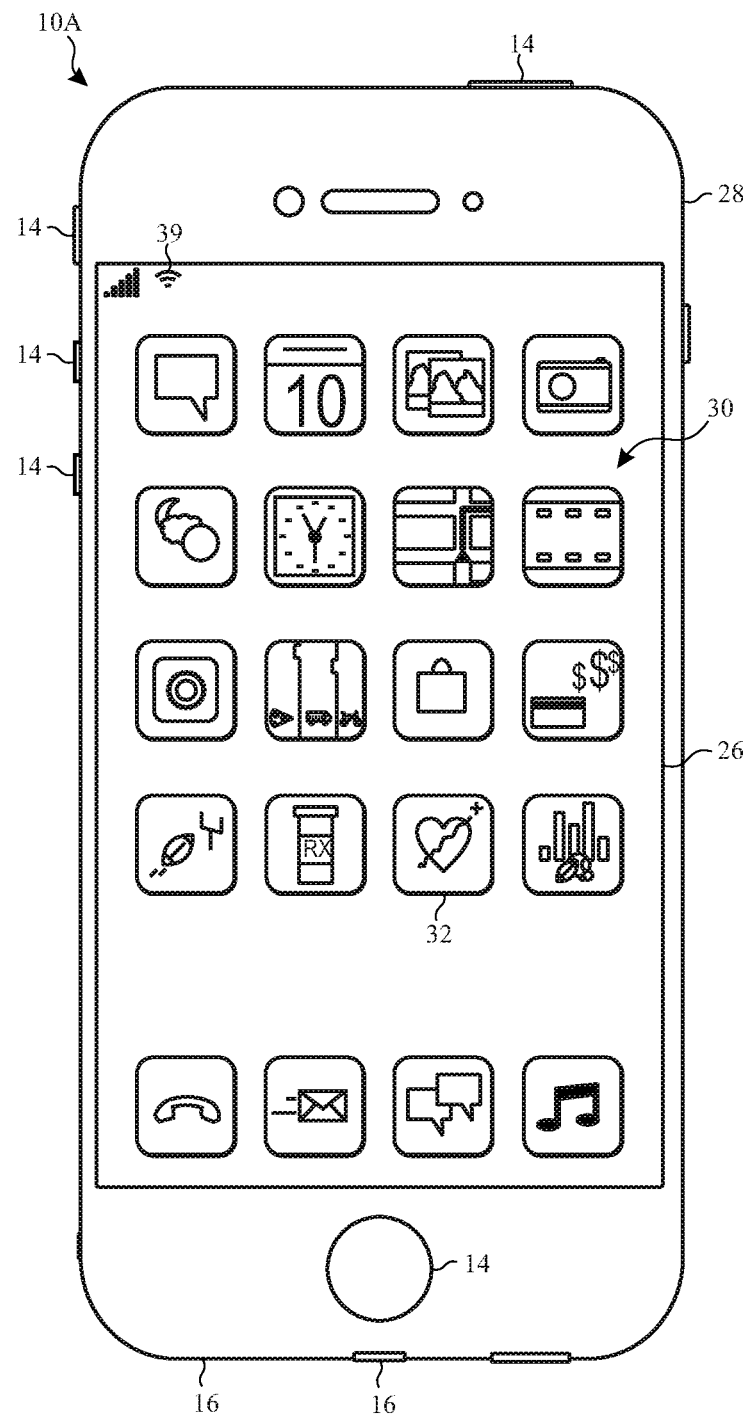
FIG. 2 is an example of the electronic device of FIG. 1, in accordance with an embodiment.

As described above, the electronic device 10 may be any suitable electronic device. To help illustrate, one example of a suitable electronic device 10, specifically a handheld electronic device 10A, is shown in FIG. 2. In some embodiments, the handheld electronic device 10A may be a portable phone, a media player, a personal data organizer, a handheld game platform, and/or the like. For example, the handheld electronic device 10A may be a smart phone, such as any iPhone® model available from Apple Inc.

As depicted, the handheld electronic device 10A includes an enclosure 28 (e.g., housing). In some embodiments, the enclosure 28 may protect interior components from physical damage and/or shield them from electromagnetic interference. Thus, a radio frequency system 12 may also be enclosed within the enclosure 28 and internal to the handheld electronic device 10A.

Additionally, as depicted, the enclosure 28 may surround the electronic display 26. In the depicted embodiment, the electronic display 26 is displaying a graphical user interface (GUI) 29 having an array of icons. By way of example, when an icon is selected either by an input device 14 or a touch sensing component of the electronic display 26, an application program may launch.

Furthermore, as depicted, input devices 14 open through the enclosure 28. As described above, the input devices 14 may enable a user to interact with the handheld electronic device 10A. For example, the input devices 14 may enable the user to activate or deactivate the handheld electronic device 10A, navigate a user interface to a home screen, navigate a user interface to a user-configurable application screen, activate a voice-recognition feature, provide volume control, and/or toggle between vibrate and ring modes. As depicted, the I/O ports 16 also open through the enclosure 28. In some embodiments, the I/O ports 16 may include, for example, an audio jack to connect to external devices.

Figure 3:
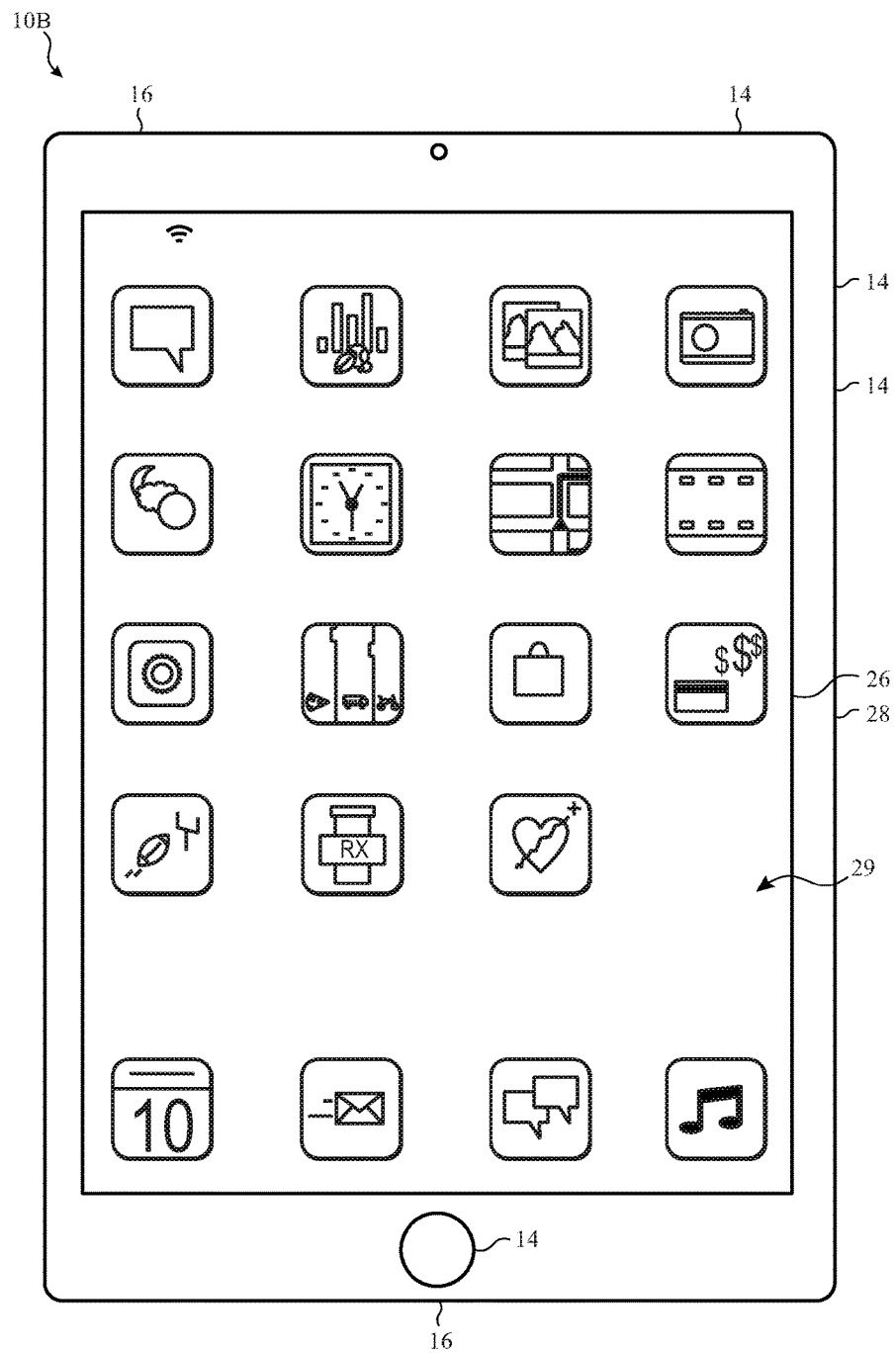
FIG. 3 is an example of the electronic device of FIG. 1, in accordance with an embodiment.
Figure 4:
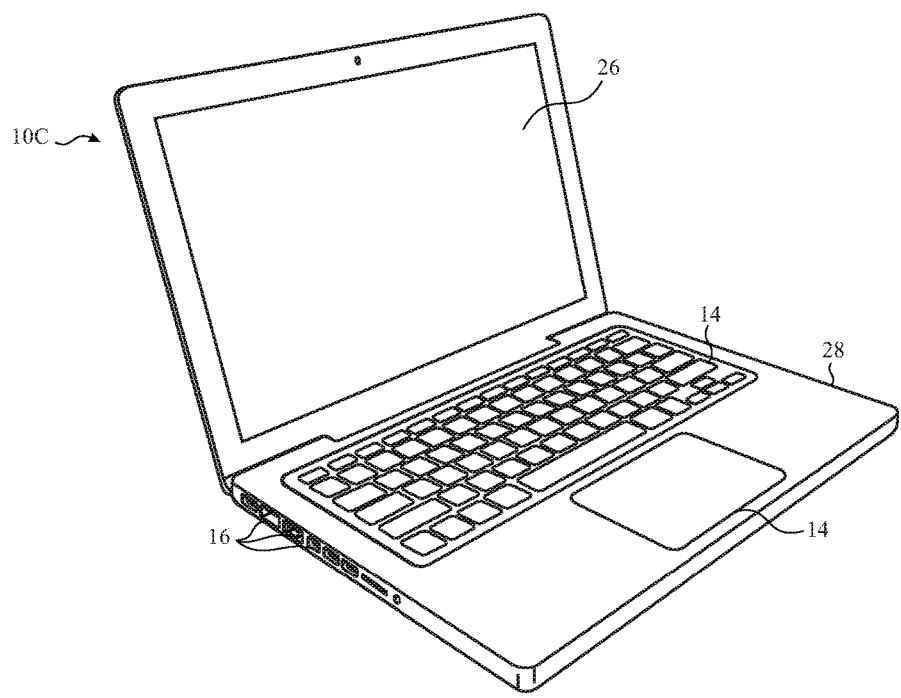
FIG. 4 is an example of the electronic device of FIG. 1, in accordance with an embodiment.
Figure 5:
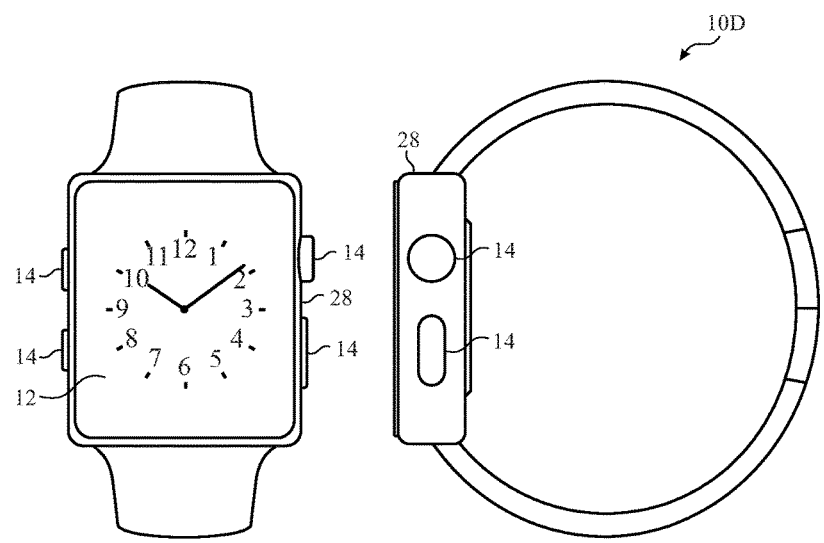
FIG. 5 is an example of the electronic device of FIG. 1, in accordance with an embodiment.

To further illustrate, another example of a suitable electronic device 10, specifically a tablet electronic device 10B is shown in FIG. 3. For example, the tablet electronic device 10B may be any iPad® model available from Apple Inc. A further example of a suitable electronic device 10, specifically a computer 10C, is shown in FIG. 4. For example, the computer 10C may be any Macbook® or iMac® model available from Apple Inc. Another example of a suitable electronic device 10, specifically a watch 10D, is shown in FIG. 5. For example, the watch 10D may be any Apple Watch® model available from Apple Inc.

As depicted, the tablet electronic device 10B, the computer 10C, and the watch 10D each also include an electronic display 26, input devices 14, I/O ports 16, and an enclosure 28. Thus, in some embodiments, the enclosure 28 may enclose a radio frequency system 12 in the tablet electronic device 10B, the computer 10C, and/or the watch 10D. As described above, a radio frequency system 12 may facilitate wirelessly communicating data with other electronic devices and/or a communication network.

Figure 6:
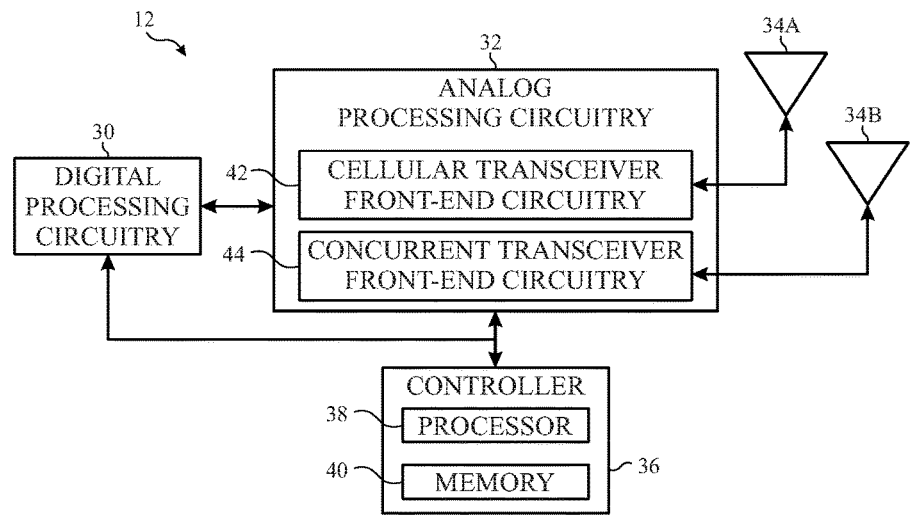
FIG. 6 is block diagram of the radio frequency system of FIG. 1 including concurrent front-end circuitry, in accordance with an embodiment.

To help illustrate, an example of a radio frequency system 12, which may be implemented in an electronic device 10, is shown in FIG. 6. As in the depicted example, a radio frequency system 12 may include digital processing circuitry 30, analog processing circuitry 32, one or more antennas 34, and a controller 36. It should be appreciated that the depicted example is merely intended to be illustrative and not limiting. For example, in other embodiments, a radio frequency system 12 may be implemented with a single antenna 34 or more than two antennas 34.

In some embodiments, the controller 36 may generally control operation of the radio frequency system 12. Although depicted as a single controller 36, in other embodiments, one or more separate controllers 36 may be used to control operation of the radio frequency system 12. To facilitate controlling operation, the controller 36 may include at least one processor 38 and memory 40. In some embodiments, the processor 38 may execute instructions and/or process data stored in the memory 40 to determine control commands that instruct the radio frequency system 12 to perform a control action. In other embodiments, the processor 38 may be hardwired with instructions that determine control commands when executed. Additionally, in some embodiments, the processor 38 may be included in the processor core complex 18 and/or separate processing circuitry and the memory 40 may be included in local memory 24, main memory storage device 20, and/or another, tangible, non-transitory computer-readable medium.

In some embodiments, the digital processing circuitry 30 may process data indicated via digital electrical signals, for example, which indicate "0" bits when voltage is below a voltage threshold and "1" bits when voltage is above the voltage threshold. Thus, in some embodiments, the digital processing circuitry 30 may include a modem, a baseband processor, and/or the like. Additionally, in some embodiments, the digital processing circuitry 30 may be communicatively coupled to the processor core complex 18 to enable the electronic device 10 to wirelessly transmit data and/or receive wirelessly transmitted data via the radio frequency system 12.

In some embodiments, the analog processing circuitry 32 may process data indicated via analog electrical signals, for example, which indicate different values via frequency modulation and/or amplitude modulation. Thus, to facilitate wirelessly transmitting data, a digital-to-analog converter (DAC) may be electrically coupled between the digital processing circuitry 30 and the analog processing circuitry 32, for example, to convert a digital electrical signal into a corresponding analog electrical signal. Additionally or alternatively, to facilitate processing wirelessly received data, an analog-to-digital converter (ADC) may be electrically coupled between the analog processing circuitry 32 and the digital processing circuitry, for example, to convert an analog electrical signal into a corresponding digital electrical signal.

In some embodiments, an antenna 34 may facilitate wireless data transmission by modulating electromagnetic (e.g., radio) waves based at least in part on an analog electrical signal received from the analog processing circuitry 32. Additionally or alternatively, an antenna 34 may facilitate wireless reception of data by outputting an analog electrical signal based at least in part on received electromagnetic waves. Furthermore, in some embodiments, a radio frequency system 12 may include multiple antennas 34, for example, to facilitate improving operational flexibility by enabling concurrent wireless communication with multiple different communication networks.

Moreover, in some embodiments, different antennas 34 in a radio frequency system 12 may be implemented to provide wireless communication with different communication networks. For example, a first antenna 34A may be implemented to provide wireless communication between the electronic device 10 and a cellular network, such as an LTE network. Additionally, a second antenna 34B may be implemented to provide wireless communication between the electronic device 10 and an 802.11x network, such as a Wi-Fi network or a Bluetooth network.

Since different types of communication networks often utilize different communication protocols, in some embodiments, each antenna 34 may be coupled to corresponding transceiver (e.g., receiver, transmitter, or both) front-end circuitry in the analog processing circuitry 32. For example, to facilitate wireless communication with a cellular network, the analog processing circuitry 32 may include cellular transceiver front-end circuitry 42 communicatively coupled to the first antenna 34A. In this manner, the cellular transceiver front-end circuitry 42 may process (e.g., amplify, convert to a radio frequency, and/or convert to a processing frequency) analog electrical signals in accordance with a cellular (e.g., LTE) communication protocol. Additionally or alternatively, to facilitate wireless communication with an 802.11x network, the analog processing circuitry 32 may include 802.11x front-end circuitry communicatively coupled to the second antenna 34B.

As described above, in some embodiments, a radio frequency system 12 may be implemented to facilitate processing of data concurrently received from multiple different communication networks. For example, to facilitate processing of concurrently received data, the second antenna 34B may be communicatively coupled to concurrent transceiver front-end circuitry 44. In some embodiments, the concurrent transceiver front-end circuitry 44 may facilitate processing of concurrently received Wi-Fi data and Bluetooth data. At least in some instances, this may facilitate improving communication efficiency of a radio frequency system 12, for example, by enabling alternation between Wi-Fi reception duty cycles and Bluetooth reception duty cycles to be obviated.

Figure 7:
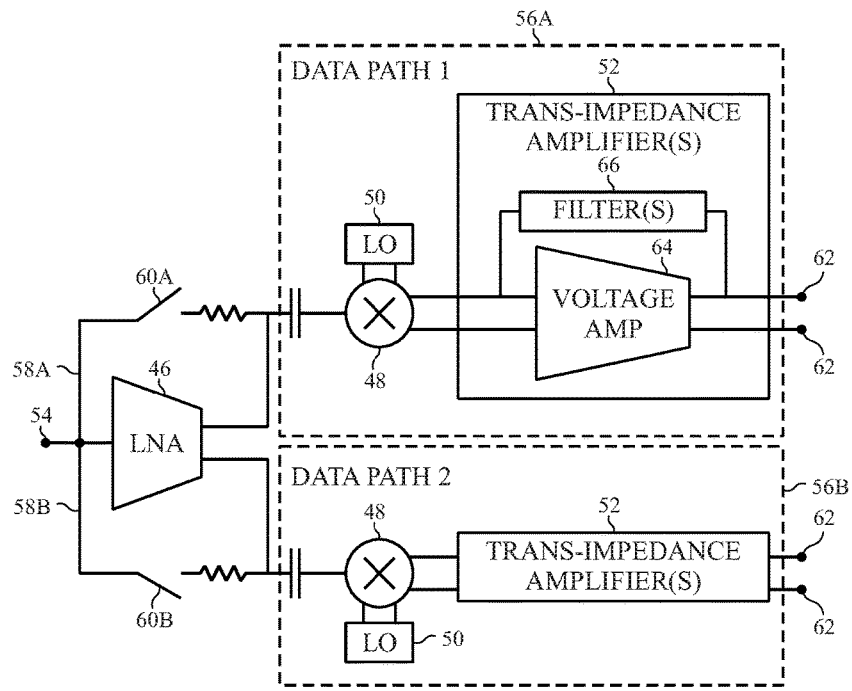
FIG. 7 is a block diagram of the concurrent front-end circuitry of FIG. 6 including a low noise amplifier, a mixer, and a trans-impedance amplifier, in accordance with an embodiment.

To help illustrate, an example of concurrent transceiver front-end circuitry 44, which may be implemented in a radio frequency system 12, is shown in FIG. 7. As in the depicted example, concurrent transceiver front-end circuitry 44 may include a low noise amplifier 46, one or more mixers 48, one or more local oscillators 50, and one or more trans-impedance amplifiers (TIAs) 52. More specifically, the low noise amplifier 46 may be electrically coupled between an input node 54 (e.g., pad or port) and multiple data paths 56. In some embodiments, the concurrent transceiver front-end circuitry 44 may include one data path 56 corresponding with each supported communication protocol. For example, to support concurrent reception from Wi-Fi networks and Bluetooth networks, a first data path 56A may be implemented in the concurrent transceiver front-end circuitry 44 to facilitate processing of Wi-Fi data and a second data path 56B may be implemented in the concurrent transceiver front-end circuitry 44 to facilitate processing of Bluetooth data.

It should be appreciated that the depicted example of concurrent transceiver front-end circuitry 44 is merely intended to be illustrative and not limiting. In particular, although two data paths 56 are depicted, concurrent transceiver front-end circuitry 44 in other embodiments may be implemented to include a single data path 56 or more than two data paths 56. For example, the concurrent transceiver front-end circuitry 44 may be implemented to additionally include a third data path 56 for supporting a third communication protocol (e.g., different from the communication protocols supported by the first data path 56A and the second data path 56B).

In some embodiments, a bypass path 58 may be electrically coupled between the input node 54 of the concurrent transceiver front-end circuitry 44 and each data path 56. For example, in the depicted example, a first bypass path 58A is electrically coupled between the input node 54 and the first data path 56A and a second bypass path 58B is electrically coupled between the input node 54 and the second data path 56B. Additionally, in some embodiments, each bypass path 58 may include a switching device 60 (e.g., transistor, relay, or contactor) to enable selectively bypassing the low noise amplifier 46 and supplying an analog electrical radio frequency signal output from an antenna 34 directly to one or more data paths 56, for example, when signal power of the analog electrical radio frequency signal is greater than a threshold signal power.

As described above, in some embodiments, a low noise amplifier 46 may be implemented to operate in a current mode. In other words, when not bypassed, the low noise amplifier 46 may produce one or more current modulated radio frequency signals based at least in part on voltage of the analog electrical radio frequency signal. For example, when Wi-Fi data and Bluetooth data are concurrently received, the low noise amplifier 46 may produce a combined current modulated radio frequency signal, which provides an analog representation of the combined Wi-Fi data and Bluetooth data. Additionally, the combined current modulated radio frequency signal may be divided between a Wi-Fi data path 56 and a Bluetooth data path 56.

In some embodiments, a data path 56 may generate one or more voltage signals modulated at a processing (e.g., intermediate or baseband) frequency and output via a corresponding output node 62 (e.g., port or pad) for subsequent processing by the digital processing circuitry 30. In some embodiments, a mixer 48 may up convert or down convert from a radio frequency to the processing frequency, for example, based at least in part on local oscillator signals generated by a local oscillator 50. Additionally, in some embodiments, a mixer 48 may divide an input radio frequency signal into in-phase components and quadrature components. For example, the mixer 48 may output a positive in-phase current modulated processing frequency signal, a negative in-phase current modulated processing frequency signal, a positive quadrature current modulated processing frequency signal, and/or a negative quadrature current modulated processing frequency signal.

To facilitate subsequent processing, a trans-impedance amplifier 52 may convert an input current modulated processing frequency signal into a corresponding voltage modulated processing frequency signal. For example, the trans-impedance amplifier 52 may output a positive in-phase voltage modulated processing frequency signal, a negative in-phase voltage modulated processing frequency signal, a positive quadrature voltage modulated processing frequency signal, and/or a negative quadrature voltage modulated processing frequency signal. In some embodiments, a trans-impedance amplifier 52 may be implemented with a voltage amplifier 64, such as an op-amp, and one or more filters 66 coupled to an input of the voltage amplifier 64 and/or an output of the voltage amplifier 64.

By implementing in this manner, concurrent transceiver front-end circuitry 44 may operate in a radio frequency system 12 to facilitate receiving and processing data concurrently received from different communication networks. At least in some instances, this may facilitate improving communication efficiency and/or operational efficiency of the radio frequency system 12 and, thus, the electronic device 10, for example, by enabling alternation between reception duty cycles corresponding with different communication networks and/or different communication protocols to be obviated.

Moreover, by implementing in this manner, concurrent transceiver front-end circuitry 44 may operate in a radio frequency system 12 to facilitate receiving and processing data received from one communication network while the radio frequency system 12 is concurrently transmitting to another communication network. At least in some instances, this may facilitate improving communication efficiency and/or operational efficiency of the radio frequency system 12 and, thus, the electronic device 10, for example, by enabling alternation between reception duty cycles and transmission duty cycles corresponding with different communication networks and/or different communication protocols to be obviated.

Figure 8:
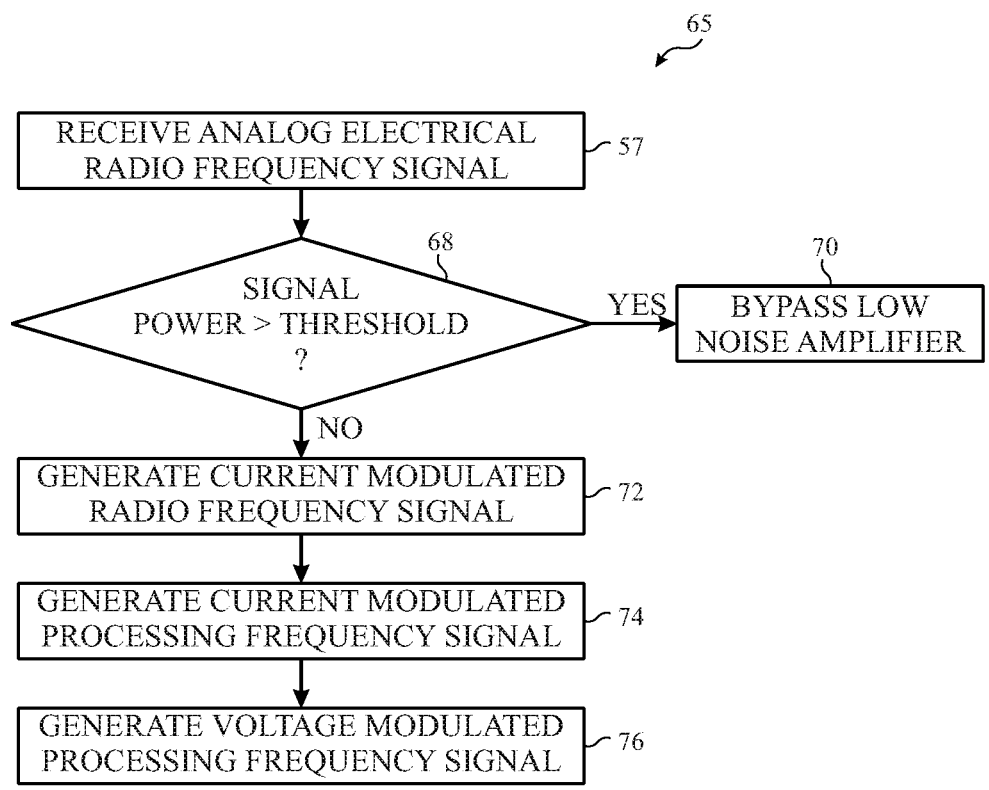
FIG. 8 is a flow diagram of a process for operating the concurrent front-end circuitry of FIG. 7, in accordance with an embodiment.

To help illustrate, an example of a process 65 for operating concurrent transceiver front-end circuitry 44 implemented in a radio frequency system 12 is described in FIG. 8. Generally, the process 65 includes receiving an analog electrical radio frequency signal (process block 67), determining whether signal power of the analog electrical radio frequency signal is greater than a threshold (decision block 68), bypassing a low noise amplifier when the signal power is greater than the threshold (process block 70), and generating a current modulated radio frequency signal when the signal power is not greater than the threshold (process block 72). Additionally, the process 65 includes generating a current modulated processing frequency signal (process block 74) and generating a voltage modulated processing frequency signal (process block 76). In some embodiments, the process 65 may be implemented at least in part by executing instructions stored in tangible, non-transitory, computer-readable media, such as memory 40, using processing circuitry, such as the processor 38.

In some embodiments, concurrent transceiver front-end circuitry 44 may receive an analog electrical radio frequency signal from a corresponding antenna 34 (process block 67). As described above, an antenna 34 may output electrical power based at least in part on its interaction with electromagnetic waves. As such, voltage and/or current induced by electromagnetic waves in the antenna 34 may be output as an analog electrical signal that oscillates (e.g., modulates) at a radio frequency.

Additionally, in some embodiments, a controller 36 may determine whether signal power of the analog electrical radio frequency signal output from the antenna 34 is greater than a signal power threshold (decision block 68). In some instances, as signal power increases, likelihood of an amplifier saturating its output signal and, thus, distorting target data may increase. As described above, in some embodiments, the transceiver front-end circuitry 44 may include a low noise amplifier 46 implemented to reduce likelihood of supplying saturated signals to its data paths 56 by operating in a current mode.

In some instances, signal power attributed to electromagnetic interference may nevertheless saturate the low noise amplifier 46. Thus, in some embodiments, the signal power threshold may be set based at least in part on saturation point of the low noise amplifier 46. Additionally, in some instances, signal power resulting from target data may already be sufficient for subsequent processing. Thus, in some embodiments, the signal power threshold may additionally or alternatively be set based at least in part on sensitivity of subsequent (e.g., downstream) processing circuitry, such as an analog-to-digital converter.

In any case, when the signal power is greater than the signal power threshold, the controller 36 may instruct the concurrent transceiver front-end circuitry 44 to bypass its low noise amplifier 46 (process block 70). To facilitate processing of concurrently received data indicated using different communication protocols, in some embodiments, the controller 36 may determine communication protocols expected to be used to indicate data on the electromagnetic waves received by the antenna 34 and, thus, the analog electrical signals output from the antenna 34. For example, when the analog electrical signals are expected to include Wi-Fi data and its signal power is greater than the signal power threshold, the controller 36 may output a control command (e.g., signal) that instructs a first switching device 60A on a first bypass path 58A to close, thereby enabling the first data path 56A to receive the analog electrical radio frequency signal directly from the input node 54. Additionally, when the analog electrical signals are expected to include Bluetooth data and its signal power is greater than the signal power threshold, the controller 36 may output a control command (e.g., signal) that instructs a second switching device 60B on a second bypass path 58B to close, thereby enabling the second data path 56B to receive the analog electrical radio frequency signal directly from the input node 54

To facilitate reducing power consumption, in some embodiments, electrical power may be disconnected from the low noise amplifier 46 when bypassed. Additionally, since the low noise amplifier 46 is bypassed, likelihood of a saturated signal being supplied to the data paths 56 may also be reduced when signal power of the analog electrical radio frequency signal is greater than the signal power threshold.

On the other hand, when signal power of the analog electrical radio frequency signal is not greater than the signal power threshold, the controller 36 may instruct the concurrent transceiver front-end circuitry 44 to generate a current modulated radio frequency signal based at least in part on voltage of the analog electrical radio frequency signal received from the antenna 34 (process block 72). For example, the controller 36 may instruct the switching devices 60 to each maintain its corresponding bypass path 58 disconnected. As such, the analog electrical radio frequency signal may be input to the low noise amplifier 46. In some embodiments, a low noise amplifier 46 may output a current modulated signal based at least in part on input voltage and, thus, output a current modulated radio frequency signal based at least in part on an analog electrical radio frequency signal received from an antenna 34.

Figure 9:
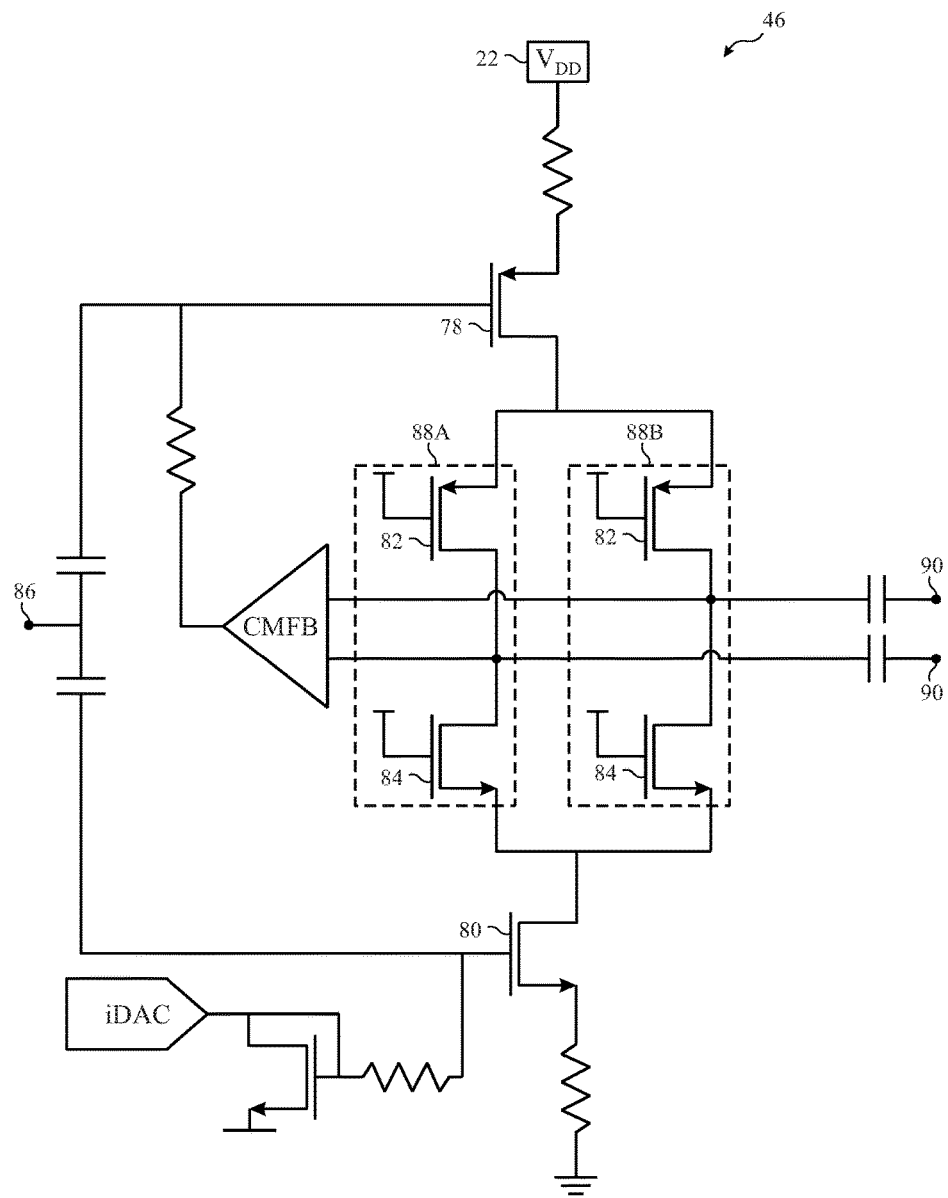
FIG. 9 is a circuit diagram of the low noise amplifier of FIG. 7, in accordance with an embodiment.

To help illustrate, an example of a low noise amplifier 46, which may be implemented in concurrent transceiver front-end circuitry 44, is shown in FIG. 9. As in the depicted example, a low noise amplifier 46 may include a positive input transistor 78, a negative input transistor 80, one or more positive cascode transistors 82, and one or more negative cascode transistors 84. In some embodiments, a positive input transistor 78 and/or a positive cascode transistors 82 may be implemented using one or more p-channel metal-oxide semiconductor (PHOS) transistors. Additionally or alternatively, a negative input transistor 80 and/or a negative cascode transistor 84 may be implemented using one or more n-channel metal-oxide semiconductor (NMOS) transistors.

As depicted, an input node 86 (e.g., pad or port) is electrically coupled to the gate of the positive input transistor 78 and the gate of the negative input transistor 80. Additionally, the source of the positive input transistor 78 may be electrically coupled to a power source 22, such as an on-board one volt $V_{DD}$ power supply while the source of the positive input transistor 78 may be electrically coupled to ground. Furthermore, the drain of the positive input transistor 78 may be electrically coupled to a positive cascode transistor 82 on each of multiple data branches 88 and the drain of the negative input transistor 80 may be electrically coupled to a negative cascode transistor 84 on each of the multiple data branches 88.

In some embodiments, the low noise amplifier 46 may include one data branch 88 corresponding with each supported communication protocol. For example, to support concurrent reception from Wi-Fi networks and Bluetooth networks, a first data branch 88A may be implemented in the low noise amplifier 46 to facilitate processing of Wi-Fi data and a second data branch 88B may be implemented in the low noise amplifier 46 to facilitate processing of Bluetooth data. In other words, each data branch 88 implemented in the low noise amplifier 46 may correspond with a data path 56 implemented in the concurrent transceiver front-end circuitry 44. Thus, as in the depicted example, each data branch 88 in the low noise amplifier 46 may be electrically coupled to a corresponding output node 90 (e.g., port or pad) between its positive cascode transistor 82 and its negative cascode transistor 84.

It should be appreciated that the depicted example low noise amplifier 46 is merely intended to be illustrative and not limiting. In particular, although two data branches 88 are depicted, low noise amplifiers 46 in other embodiments may be implemented to include as single data branch 88 or more than two data branches 88. For example, the low noise amplifier 46 may be implemented to additionally include a third data branch 88 for support of a third communication protocol (e.g., different from the communication protocols supported by the first data branch 88A and the second data branch 88B).

Figure 10:
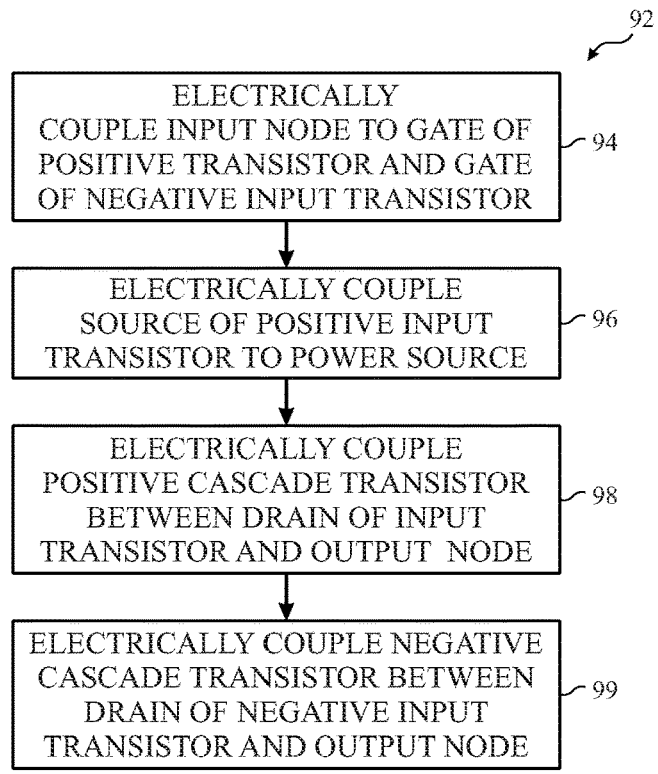
FIG. 10 is a flow diagram of a process for implementing the low noise amplifier of FIG. 9, in accordance with an embodiment.

In any case, an example of a process 92 for implementing a low noise amplifier 46 is described in FIG. 10. Generally, the process 92 includes electrically coupling an input node to a gate of an input transistor (process block 94), electrically coupling a source of the input transistor to a power source (process block 96), and electrically coupling a transcode transistor between a drain of the input transistor and a corresponding output node (process block 98). In some embodiments, the process 92 may be performed by manufacturing equipment and/or machines, for example, based on instructions received from a control system or an operator. As described above, when implemented in this manner, a low noise amplifier 46 may operate to facilitate processing of data concurrently received by one antenna 34 (e.g., second antenna 34B) from multiple different communication networks.

Figure 11:
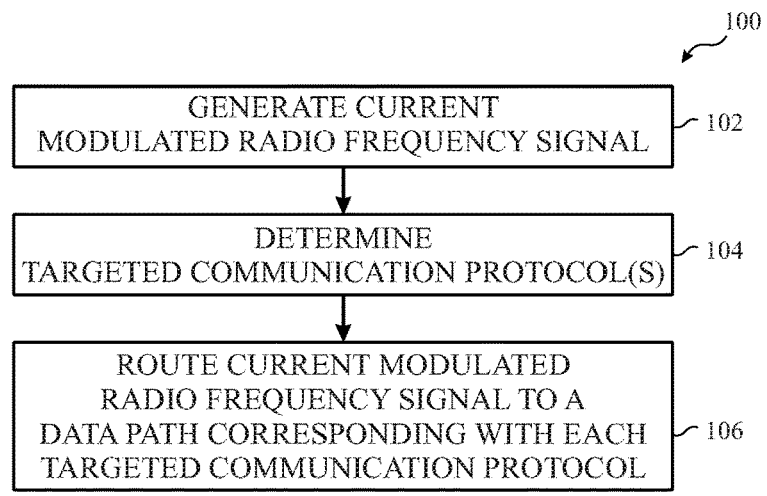
FIG. 11 is a flow diagram of a process for operating the low noise amplifier of FIG. 9, in accordance with an embodiment.

To help further illustrate, an example of a process 100 for operating a low noise amplifier 46 implemented in concurrent transceiver front-end circuitry 44 is described in FIG. 11. Generally, the process 100 includes generating a current modulated radio frequency signal (process block 102), determining one or more targeted communication protocols (process block 104), and routing the current modulated radio frequency signal to a data path corresponding with each targeted communication protocol (process block 106). In some embodiments, the process 100 may be implemented at least in part by executing instructions stored in a tangible, non-transitory, computer-readable medium, such as memory 40, using processing circuitry, such as processor 38.

As described above, in some embodiments, a low noise amplifier 46 in a radio frequency system 12 may generate a current modulated radio frequency signal based at least in part on an analog electrical radio frequency signal output from an antenna 34 (process block 102). To facilitate generating the current modulated radio frequency signal, the low noise amplifier 46 may be implemented such that the positive input transistor 78 and the negative input transistor 80 each operates in its linear region, for example, at least over a range of signal powers (e.g., less than the signal power threshold) expected to be output from the antenna 34. Thus, when voltage of the input analog electrical radio frequency signal is positive, the positive input transistor 78 may vary its channel width and, thus, current flow supplied to the data branches 88 with the voltage of the analog electrical radio frequency signal. On the other hand, when voltage of the input analog electrical radio frequency signal is negative, the negative input transistor 80 may vary its channel width and, thus, current flow supplied to the data branches 88 with the voltage of the analog electrical radio frequency signal.

In other words, when an analog electrical radio frequency signal is input, the low noise amplifier 46 may output an analog electrical signal with a relatively constant voltage and current modulated at a radio frequency. Additionally, when the antenna 34 generates the analog electrical radio frequency signal based on data concurrently received from multiple different communication networks, the current modulated radio frequency signal produced by the low noise amplifier 46 may provide a combined analog representation of the concurrently received data. However, as described above, processing of data wireless received from different communication networks may differ, for example, to account for differences in communication protocol.

Thus, a controller 36 may determine communication protocols targeted by the radio frequency system 12 (process block 104). In some embodiments, the controller 36 may determine the targeted communication protocols based at least in part on the communication networks from which the radio frequency system 12 expects to receive data. For example, when an electronic device 10 expects to wirelessly receive data from a Wi-Fi network, the controller 36 may determine that the Wi-Fi communication protocol is targeted. Similarly, when the electronic device 10 expects to wirelessly receive data from a Bluetooth network, the controller 36 may determine that the Bluetooth communication protocol is targeted. Thus, in some embodiments, the controller 36 may determine the targeted communication protocols based at least in part on indication, for example, received from the processor core complex 18.

Additionally, the controller 36 may instruct the low noise amplifier 46 to route the current modulated radio frequency signal to a data branch 88 and, thus, a data path 56 corresponding with each targeted communication protocol (process block 106). To facilitate routing, in some embodiments, the positive cascode transistor 82 and the negative cascode transistors 84 on a data branch 88 corresponding with a targeted communication protocol may be implemented to operate in its saturated region. In other words, the controller 36 may control gate voltage supplied to the cascode transistors such that each cascode transistor corresponding with a targeted communication protocol is supplied a gate voltage greater than its threshold voltage, thereby saturating its channel width. In some embodiments, to control gate voltage applied to a cascode transistor, the controller 36 may output a control command, which is converted to an analog electrical signal by a digital-to-analog converter and supplied to the gate of the cascode transistor.

Thus, when only one communication protocol is targeted, the current modulated radio frequency signal may be routed through a single data branch 88. For example, when the Wi-Fi communication protocol is targeted, current modulated radio frequency signal may be routed through the first data branch 88A to the first data path 56A. Similarly, when the Bluetooth communication protocol is targeted, the current modulated radio frequency signal may be routed through the second data branch 88B to the second data path 56B.

On the other hand, when multiple different communication protocols are targeted, the current modulated radio frequency signal may be routed to multiple data branches 88. In other words, the current modulated radio frequency signal may be divided such that a portion of the current modulated radio frequency signal is routed to each data branch 88 corresponding with one of the targeted communication protocols. For example, when the Wi-Fi communication protocol and the Bluetooth communication protocol are both targeted, a first portion of the current modulated radio frequency signal may be routed through the first data branch 88A and a second portion of the current modulated radio frequency signal may be routed through the second data branch 88B, thereby dividing (e.g., halving) magnitude of the current modulated radio frequency signal. In this manner, the low noise amplifier 46 may generate one or more current modulated radio frequency signals based at least in part on an analog electrical radio frequency signal received from an antenna 34.

Returning to the process 65 of FIG. 8, the concurrent transceiver front-end circuitry 44 may generate one or more current modulated processing frequency signals (process block 74). To facilitate subsequent processing, in some embodiments, a mixer 48 in the concurrent transceiver front-end circuitry 44 up convert or down convert frequency of an input signal (e.g., analog electrical radio frequency signal received from a corresponding bypass path 58 or current modulated radio frequency signal received from the low noise amplifier 46). For example, the mixer 48 may convert the input signal from a radio frequency to a processing (e.g., intermediate or baseband) frequency expected by the digital processing circuitry 30. Additionally, in some embodiments, the mixer 48 may determine in-phase components and/or quadrature components of the input signal.

Figure 12:
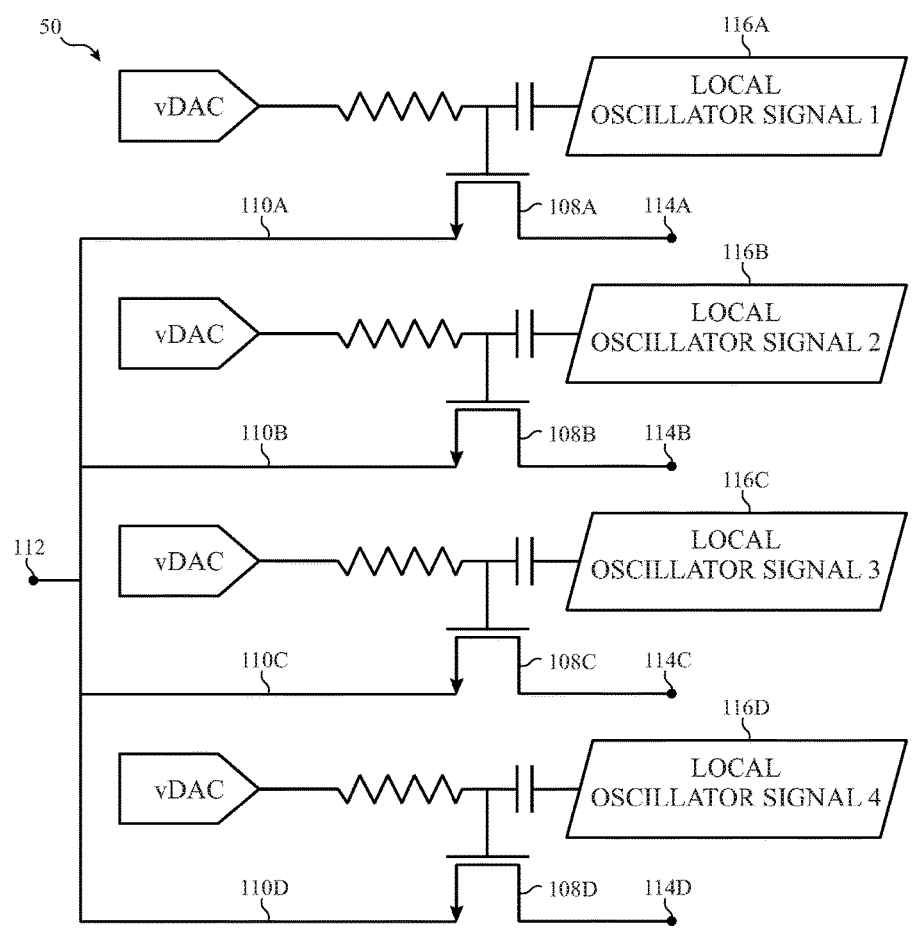
FIG. 12 is a circuit diagram of the mixer of FIG. 7, in accordance with an embodiment.

To help illustrate, an example of a mixer 48, which may be implemented in concurrent transceiver front-end circuitry 44, is shown in FIG. 12. As in the depicted example, a mixer 48 may include one or more mixer transistors 108 each electrically coupled on a component path 110 between an input node 112 (e.g., port or pad) and a corresponding output node 114 (e.g., port or pad). In some embodiments, the mixer 48 may include one component path 110 for each in-phase component and/or quadrature component. For example, the mixer 48 may include a first component path 110A that outputs an (e.g., positive) in-phase component and a second component path 110B that outputs a (e.g., positive) quadrature component. Additionally, when a radio frequency system 12 implements a differential scheme, the mixer 48 may include a third component path 110C that outputs a negative in-phase component and a fourth component path 110D that outputs a negative quadrature component.

As described above, to facilitate converting to the processing frequency, a local oscillator 50 coupled to the mixer 48 may generate one or more local oscillator signals 116 each with voltage that oscillates at a local oscillator frequency. Additionally, to facilitate identifying in-phase and quadrature components, the corresponding local oscillator 50 may generate multiple local oscillator signals 116 each phase shifted relative to one another. Based at least in part on the local oscillator signals 116, the mixer 48 may operate to up convert or down convert frequency of an input radio frequency signal (e.g., current modulated radio frequency signal or analog electrical radio frequency signal) to facilitate subsequent processing, for example, by a corresponding trans-impedance amplifier 52 and/or the digital processing circuitry 30.

Figure 13:
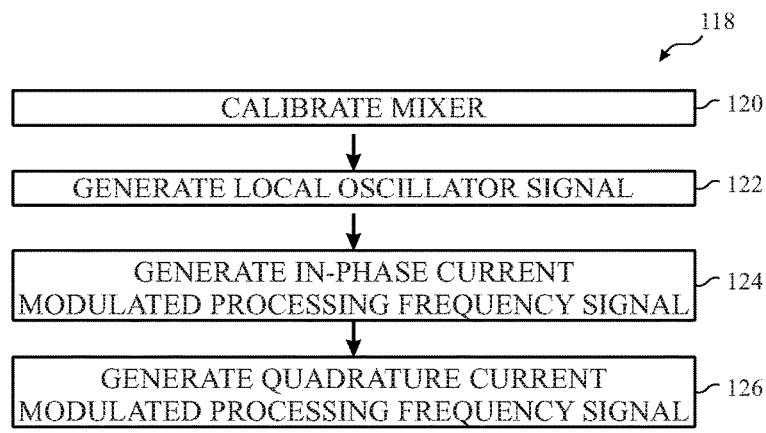
FIG. 13 is a flow diagram of a process for operating the mixer of FIG. 12, in accordance with an embodiment.

To help illustrate, an example of a process 118 for operating a mixer 48 implemented in concurrent transceiver front-end circuitry 44 is described in FIG. 13. Generally, the process 118 includes calibrating a mixer (process block 120), generating a local oscillator signal (process block 122), generating an in-phase current modulated processing frequency signal (process block 124), and generating a quadrature current modulated processing frequency signal (process block 126). In some embodiments, at least a portion of the process 118 may be implemented by executing instructions stored in tangible, non-transitory, computer-readable media, such as memory 40, using processing circuitry, such as processor 38.

Accordingly, in some embodiments, a controller 36 may instruct a local oscillator 50 to generate one or more local oscillator signals 116 (process block 124). For example, to generate a local oscillator signal 116, the controller 36 may instruct the local oscillator 50 to oscillate its output voltage at a local oscillator frequency. As described above, when supplied to a mixer 48, a local oscillator signal 116 may enable a corresponding mixer transistor 108A to convert an input signal from one (e.g., radio) frequency to a different (e.g., processing) frequency. Thus, to facilitate subsequent processing of data indicated by an input radio frequency signal, the local oscillator frequency may be determined based at least in part on the radio frequency and a processing frequency expected to be received by subsequent circuitry.

In some embodiments, subsequent circuitry may be implemented to separately process in-phase components and quadrature components. To facilitate subsequent processing in such embodiments, the controller 36 may instruct the local oscillator 50 to output two or more phase-shifted local oscillator signals 116. Moreover, in some embodiments, subsequent circuitry may be implemented using a differential scheme. Thus, to facilitate subsequent processing in such embodiments, the controller 36 may instruct the local oscillator 50 to output four local oscillator signals 116 each phase shifted ninety degrees relative to two of the other local oscillator signals 116, thereby resulting in two of the local oscillator signals 116 being one-hundred eighty degrees phase shifted relative to one another and the other two local oscillator signals 116 being one-hundred eighty degrees phase shifted relative to one another.

By supplying the phase shifted local oscillator signals 116 to the mixer transistors 108, the mixer 48 may convert an input radio frequency signal to a processing (e.g., intermediate or baseband) frequency by generating one or more in-phase current modulated processing frequency signals (process block 124) and/or generating one or more quadrature current modulated processing frequency signals (process block 126). For example, with regard to FIG. 12, the first mixer transistor 108A may produce a positive in-phase current modulated processing frequency signal when supplied a first local oscillator signals 116A. Additionally, the second mixer transistor 108B may produce a positive quadrature current modulated processing frequency signal when supplied a second local oscillator signals 116B, which is ninety degrees delayed relative to the first local oscillator signals 116A. The third mixer transistor 108C may produce a negative in-phase current modulated processing frequency signal when supplied a third local oscillator signals 116C, which is ninety degrees delayed relative to the second local oscillator signals 116B. Furthermore, the fourth mixer transistor 108D may produce a negative quadrature current modulated processing frequency signal when supplied a fourth local oscillator signals 116D, which is ninety degrees delayed relative to the third local oscillator signals 116C.

However, at least in some instances, an input radio frequency signal may include target data as well as electromagnetic interference, for example, due to the first antenna 34A transmitting an LTE signal at a frequency relatively close to transmission frequency of one or more 802.11x signals received by the second antenna 34B. When passed through the mixer 48, intermodulation between the electromagnetic interference and a local oscillator signal 116 may produce a second-order response, for example, close to the processing frequency. Generally, likelihood of second-order responses affecting subsequent processing may be reduced by increasing the second-order intercept point (IP2).

In some embodiments, second-order intercept point performance of a mixer 48 may be affected by switching timing of its mixer transistors 108. For example, second-order intercept point performance may improve the closer switching timing of the mixer transistors 108 is to ninety degrees offset from one another. However, in some instances, synchronization between local oscillator signals 116 and, thus, switching of the mixer transistor 108 may drift.

Accordingly, to facilitate improving second-order intercept point performance, the controller 36 may calibrate the mixer 48 by adjusting (e.g., biasing) one or more of the local oscillator signals 116 and, thus, gate voltage applied to corresponding mixer transistors 108 (process block 120). In some embodiments, to control gate voltage applied to a mixer transistor 108, the controller 36 may output a control command, which is converted to an analog electrical signal by a digital-to-analog converter and supplied to the gate of the mixer transistor 108 along with a corresponding local oscillator signal 116. In this manner, each data path 56 in the concurrent transceiver front-end circuitry 44 may generate one or more current modulated processing frequency signals based at least in part on a current modulated radio frequency signal received from the low noise amplifier 46 or an analog electrical radio frequency signal received via a corresponding bypass path 58.

Returning to the process 65 of FIG. 8, to facilitate subsequent processing, the concurrent transceiver front-end circuitry 44 may generate a voltage modulated processing frequency signal based at least in part on a corresponding current modulated processing frequency signal (process block 76). For example, in some embodiments, each data path 56 in the concurrent transceiver front-end circuitry 44 may output a positive in-phase voltage modulated processing frequency signal, a negative in-phase voltage modulated processing frequency signal, a positive quadrature voltage modulated processing frequency signal, and a negative quadrature voltage modulated processing frequency signal. As described above, in some embodiments, a trans-impedance amplifier 52 included on each data path 56 may convert each input current modulated signal to a corresponding voltage modulated signal, for example, which may then be converted to a digital electrical signal and processed by the digital processing circuitry 30.

Figure 14:
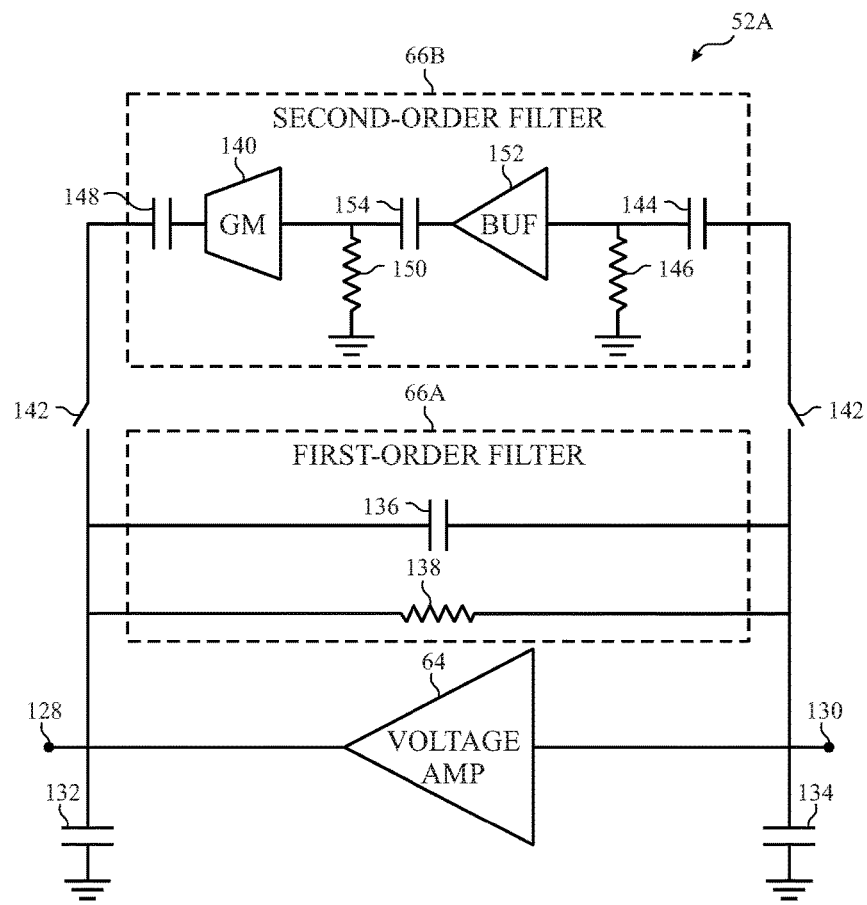
FIG. 14 is a circuit diagram of an example of the trans-impedance amplifier of FIG. 7, in accordance with an embodiment.
Figure 15:
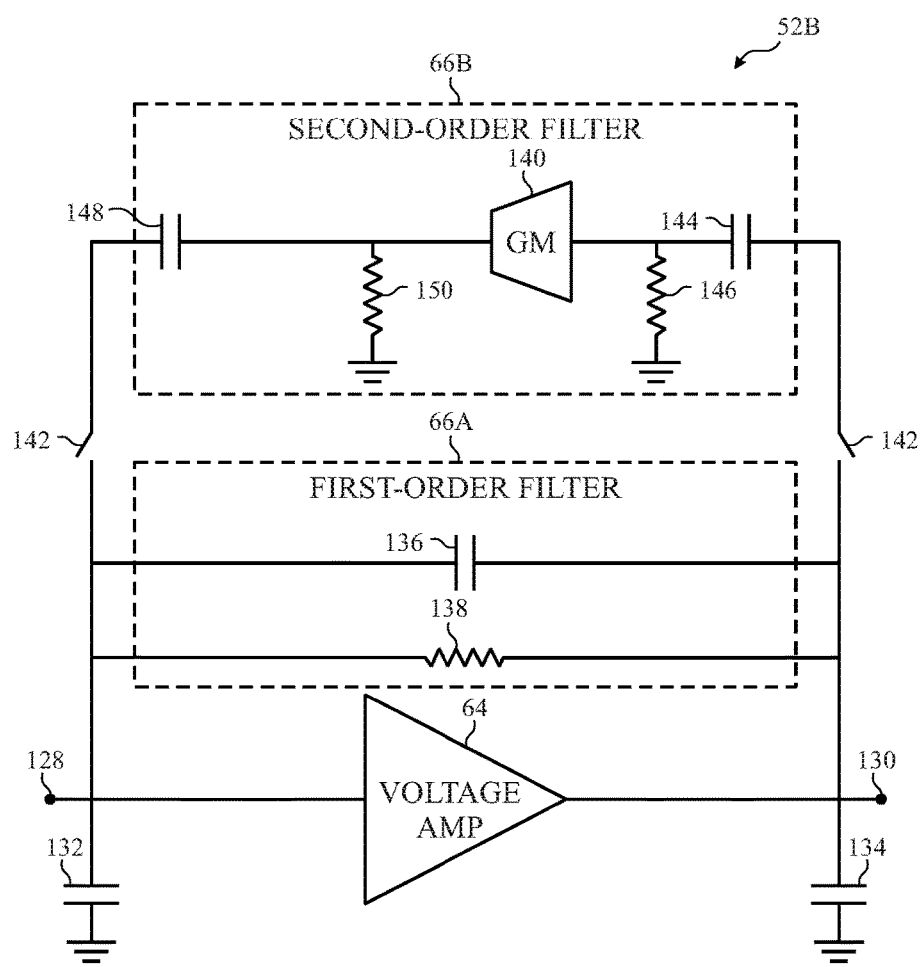
FIG. 15 is a circuit diagram of another example of the trans-impedance amplifier of FIG. 7, in accordance with an embodiment.
Figure 16:
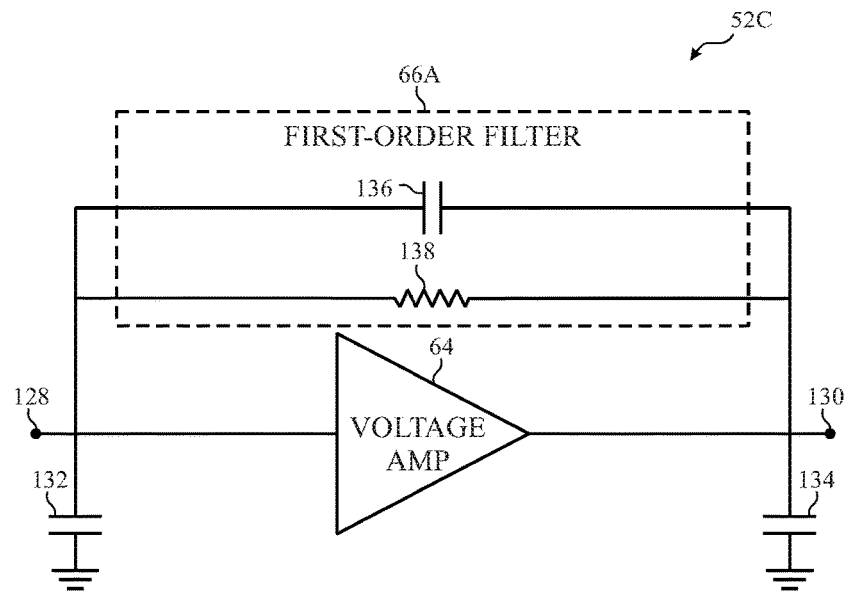
FIG. 16 is a circuit diagram of another example of the trans-impedance amplifier of FIG. 7, in accordance with an embodiment.

Additionally, as described above, a trans-impedance amplifier 52 may be implemented, in some embodiments, with a voltage amplifier 64 and one or more filters 66 electrically coupled to its input and/or its output. To help illustrate, three example implementations of a trans-impedance amplifier 52 are shown in FIGS. 14-16. In particular, a first trans-impedance amplifiers 52A is shown in FIG. 14, a second trans-impedance amplifiers 52B is shown in FIG. 15, and a third trans-impedance amplifiers 52C is shown in FIG. 16.

As depicted, the first trans-impedance amplifiers 52A, the second trans-impedance amplifiers 52B, and the third trans-impedance amplifiers 52C each includes a voltage amplifier 64 electrically coupled between its input node 128 (e.g., pad or port) and its output node 130 (e.g., pad or port). Additionally, as depicted, the first trans-impedance amplifiers 52A, the second trans-impedance amplifiers 52B, and the third trans-impedance amplifiers 52C each includes a first-order filter 66A electrically coupled between its input node 128 and its output node 130, thereby producing a first-order response in each of their corresponding transfer functions. As in the depicted examples, a first-order filter 66A may be implemented with a feedback capacitor 136 and a feedback resistor 138 electrically coupled in parallel between the input node 128 and the output node 130 of a trans-impedance amplifier 52.

Furthermore, as depicted, the first trans-impedance amplifiers 52A and the second trans-impedance amplifiers 52B each includes a second-order filter 66B. As in the depicted examples, a second-order filter 66B may be implemented with a transconductor 140 and, thus, may consume significant electrical power when in operation. Accordingly, in some embodiments, a second-order filter 66B may be selectively operated to facilitate reducing power consumption. To enable selective operation, as in the depicted examples, one or more switching devices 142 may be electrically coupled between the input node 128 of a trans-impedance amplifier 52 and its second-order filter 66B and/or between the output node 130 of the trans-impedance amplifier 52 and its second-order filter 66B. Thus, in such embodiments, a controller 36 may disable the second-order filter 66B by instructing each of the switching device 142 to maintain an open (e.g., disconnected) position and enable the second-order filter 66B by instructing each of the switching device 142 to maintain a closed (e.g., connected) position, thereby enabling a second-order response to be selectively included in the transfer function of a corresponding trans-impedance amplifier 52.

In addition to the transconductor 140, the second-order filters 66B implemented in the first trans-impedance amplifiers 52A and the second trans-impedance amplifiers 52B each includes a first capacitor 144, a first resistor 146, a second capacitor 148, and a second resistor 150. In some embodiments, the second capacitor 148 may be implemented with a large capacitance to facilitate blocking flicker noise produced by the second-order filter 66B, thereby reducing likelihood of the flicker noise degrading the noise factor associated with a corresponding trans-impedance amplifier 52. Additionally, as depicted, the second-order filter 66B implemented in the first trans-impedance amplifiers 52A includes a voltage buffer 152 and a third capacitor 154. To facilitate reducing power consumption and/or implementation associated cost, as depicted, the second-order filters 66B in the second trans-impedance amplifiers 52B is implemented without the voltage buffer 152 and the third capacitor 154.

To facilitate stabilizing operation, a trans-impedance amplifier 52 may include an input capacitor 132 electrically coupled between its input node 128 and ground as well as an output capacitor 134 electrically coupled between its output node 130 and ground. In some embodiments, adjusting (e.g., increasing) capacitance of the input capacitor 132 may produce a second-order response in the transfer function of a trans-impedance amplifier 52. Additionally, in some embodiments, frequency location of a first pole and/or frequency location of a second pole may vary based at least in part on capacitance of the output capacitor 134.

In fact, in some embodiments, implementing the input capacitor 132 and/or the output capacitor 134 with tunable (e.g., adjustable) capacitances may enable moving the first pole and the second pole closer together to provide second-order filtering, for example, such that they are on top of one another. Thus, as in the third trans-impedance amplifier 52C, a separate second-order filter 66B may be obviated, which at least in some instances may facilitate reducing power consumption and/or implementation associated cost.

Figure 17:
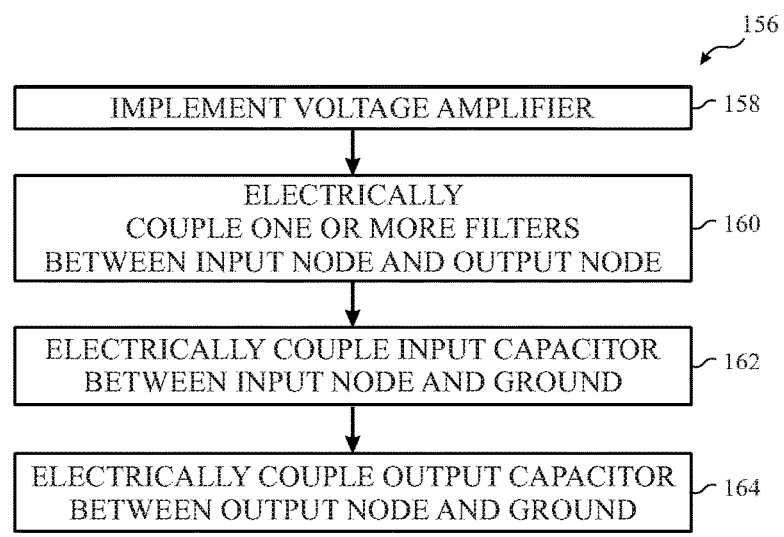
FIG. 17 is a flow diagram of a process for implementing the trans-impedance amplifier of FIG. 7, in accordance with an embodiment.

In any case, an example of a process 156 for implementing a trans-impedance amplifier 52 is described in FIG. 17. Generally, the process 156 includes implementing a voltage amplifier (process block 158), electrically coupling one or more filters between an input node and an output node (process block 160), electrically coupling an input capacitor between the input node and ground (process block 162), and electrically coupling an output capacitor between the output node and ground (process block 164). In some embodiments, the process 156 may be performed by manufacturing equipment and/or machines, for example, based on instructions received from a control system or an operator.

Figure 18:
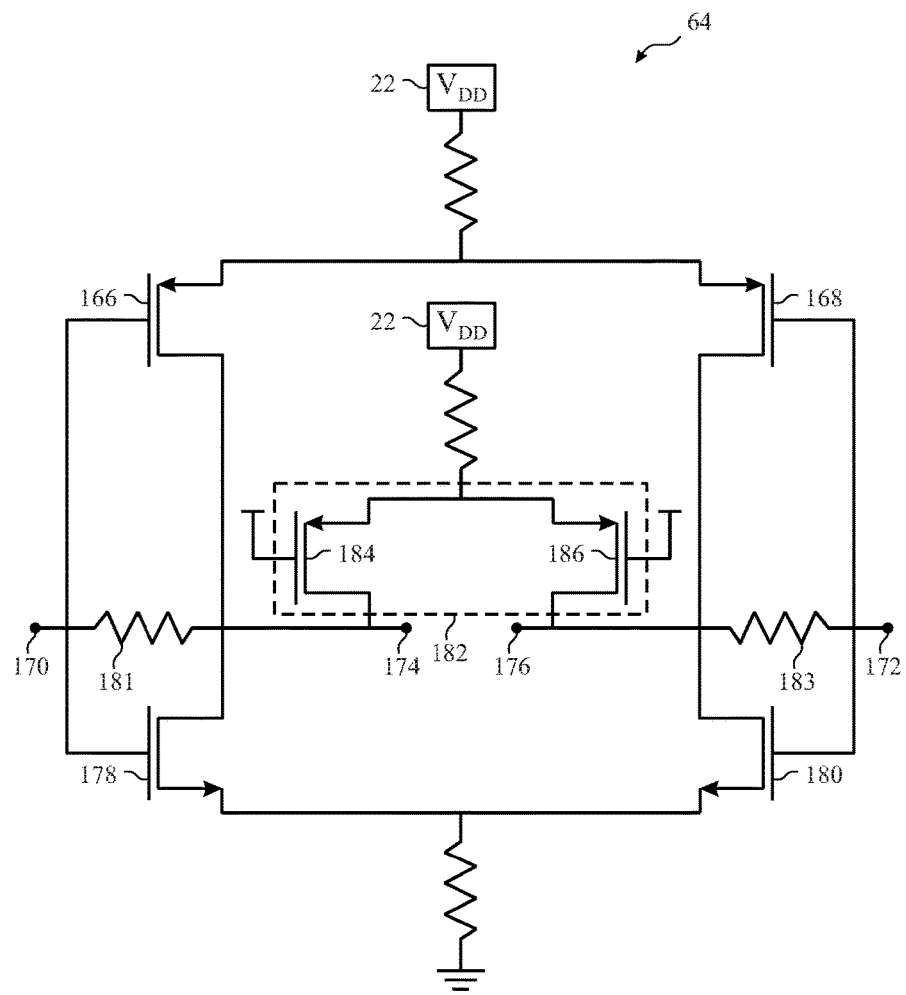
FIG. 18 is a circuit diagram of a voltage amplifier implemented in the trans-impedance amplifier of FIG. 7, in accordance with an embodiment.

Additionally, in some embodiments, a voltage amplifier 64 may be implemented as a differential amplifier. To help illustrate, an example of a voltage amplifier 64, which may be implemented in a trans-impedance amplifier 52, is shown in FIG. 18. As depicted, the voltage amplifier 64 includes a first PMOS 166 and a second PMOS 168 electrically coupled as a differential pair. More specifically, the source of the first PMOS 166 and the source of the second PMOS 168 may both be electrically coupled to a power source 22, such as an on-board one volt $V_{DD}$ power supply. Additionally, the gate of the first PMOS 166 may be electrically coupled to a positive differential input 170 (e.g., input node 128) and the gate of the second PMOS 168 may be electrically coupled to a negative differential input 172 (e.g., input node 128). Furthermore, the drain of the first PMOS 166 may be electrically coupled to a positive differential output 174 (e.g., output node 130) and the drain of the second PMOS 168 may be electrically coupled to a negative differential output 176 (e.g., output node 130).

Additionally, the voltage amplifier 64 includes a first NMOS 178 and a second NMOS 180 electrically coupled as a differential pair. More specifically, the source of the first NMOS 178 and the source of the second NMOS 180 may both be electrically coupled to ground. Additionally, the gate of the first NMOS 178 may be electrically coupled to the positive differential input 170 and the gate of the second NMOS 180 may be electrically coupled to the negative differential input 172. Furthermore, the drain of the first NMOS 178 may be electrically coupled to the positive differential output 174 and the drain of the second NMOS 180 may be electrically coupled to the negative differential output 176.

Moreover, the voltage amplifier 64 is implemented to provide a shunt-shunt feedback loop. More specifically, a first feedback resistor 181 (e.g., feedback resistor 138) may be electrically coupled between the positive differential input 170 and the positive differential output 174. Additionally, a second feedback resistor 183 (e.g., feedback resistor 138) may be electrically coupled between the negative differential input 172 and the negative differential output 176.

To facilitate compensating for non-ideal operation of the first PMOS 166 and the second PMOS 168, in some embodiments, a voltage amplifier 64 may be implemented with direct current (DC) offset cancelling circuitry 182. As depicted, the direct current offset cancelling circuitry 182 includes a third PMOS 184 and a fourth PMOS 186 electrically coupled as a differential pair. More specifically, the source of the third PMOS 184 and the source of the fourth PMOS 186 may both be electrically coupled to the power source 22. Additionally, the drain of the third PMOS 184 may be electrically coupled to the positive differential output 174 and the drain of the second PMOS 168 may be electrically coupled to the negative differential output 176.

In some embodiments, the third PMOS 184 may be a downscaled replica of the first PMOS 166 and the fourth PMOS 186 may be a downscaled replica of the second PMOS 168. Additionally, in some embodiments, a controller 36 may control gate voltage applied to the third PMOS 184 and/or gate voltage applied to the fourth PMOS 186, for example, to facilitate balancing the voltage amplifier 64 by compensating for mismatch between a positive direct current offset and a negative direct current offset. In some embodiments, to control gate voltage applied to the third PMOS 184 and/or the fourth PMOS 186, the controller 36 may output a control command, which is converted to an analog electrical signal by a digital-to-analog converter and supplied to the gate of third PMOS 184 and/or the gate of the fourth PMOS 186.

Figure 19:
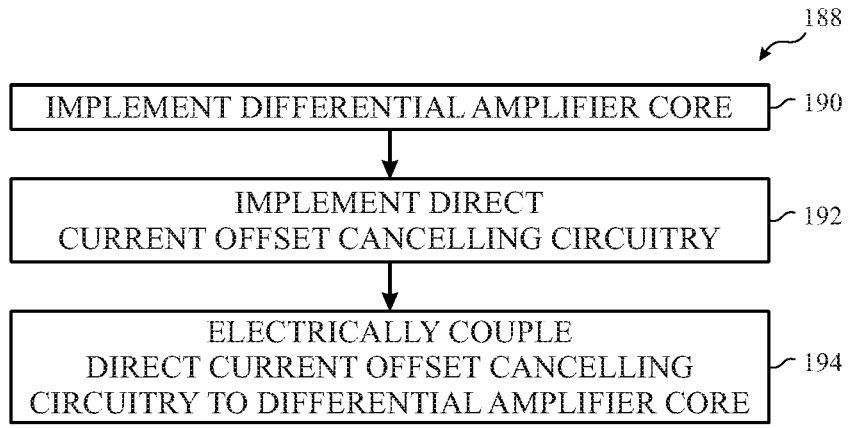
FIG. 19 is a flow diagram of a process for implementing the voltage amplifier of FIG. 18, in accordance with an embodiment.

An example of a process 188 for implementing a voltage amplifier 64 is described in FIG. 19. Generally, the process 188 includes implementing a differential amplifier core (process block 190), implementing direct current offset cancelling circuitry (process block 192), and electrically coupling the direct current offset cancelling circuitry to the differential amplifier core (process block 194). In some embodiments, the process 188 may be performed by manufacturing equipment and/or machines, for example, based on instructions received from a control system or an operator.

As described above, to implement a trans-impedance amplifier 52, one or more filters 66, an input capacitor 132, and an output capacitor 134 may be coupled to the voltage amplifier 64. Additionally, as described above, a trans-impedance amplifier 52 implemented in this manner facilitate receiving wirelessly transmitted data from one communication network via one antenna 34 (e.g., second antenna 34B) while another antenna 34 (e.g., first antenna 34A) is concurrently transmitting data to a different communication network. In particular, the trans-impedance amplifier 52 may operate to apply at least first-order filtering, which is generally sufficient to filter out (e.g., attenuate) electromagnetic interference.

Nevertheless, in some instances, the first-order filtering may be insufficient, for example, when the first antenna 34A transmits an LTE signal with an output power above a threshold output power and/or using a frequency within a threshold distance from the industrial, scientific, and medical (ISM) band targeted by the second antenna 34B. Accordingly, when such instances occur, the trans-impedance amplifier 52 may operate to introduce a second-order response, which reduces likelihood of the transmitted signal interfering with (e.g., jamming or block) a data portion of the received signal.

Figure 20:
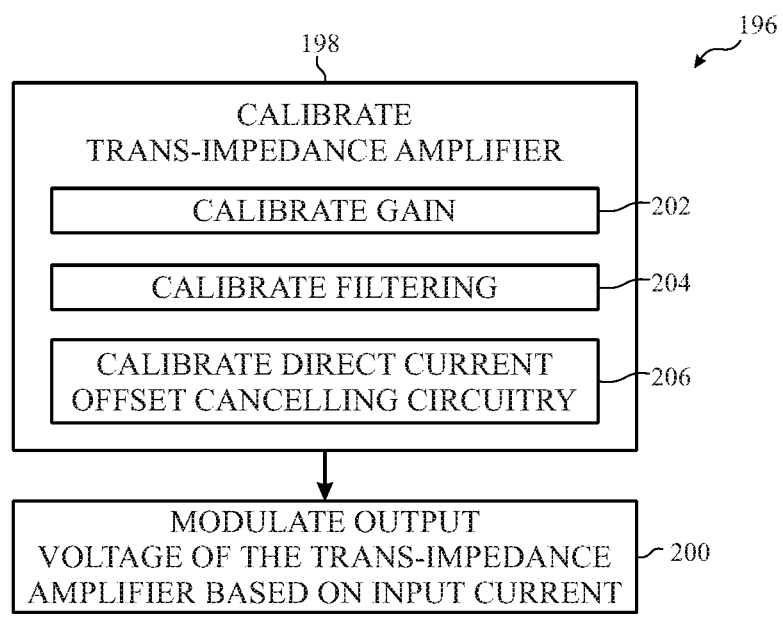
FIG. 20 is a flow diagram of a process for operating the trans-impedance amplifier of FIG. 7, in accordance with an embodiment.

To help illustrate, an example of a process 196 for operating a trans-impedance amplifier 52, which may be implemented in concurrent transceiver front-end circuitry 44, is described in FIG. 20. Generally, the process 196 includes calibrating a trans-impedance amplifier (process block 198) and modulating output voltage of the trans-impedance amplifier based at least in part on input current (process block 200). In some embodiments, at least a portion of the process 196 may be implemented by executing instructions stored in tangible, non-transitory, computer-readable media, such as memory 40, using processing circuitry, such as the processor 38.

Accordingly, in some embodiments, a controller 36 may calibrate (e.g., tune) a trans-impedance amplifier 52 to facilitate subsequent processing of data indicated by output voltage modulated processing frequency signals (process block 102). As described above, the voltage modulated processing frequency signals may be generated based at least in on electromagnetic waves received by an antenna 34, which include a data portion (e.g., target data) and, at least in some instances, an interference portion caused by electromagnetic interference. Since power of transmitted electromagnetic waves decrease quadratically, the power of the data portion may be relatively small.

As such, to facilitate subsequent processing, the controller 36 may calibrate the trans-impedance amplifier 52 to control applied gain and, thus, power of the voltage modulated processing frequency signals (process block 202). In some embodiments, the controller 36 may determine a target gain value to be applied based at least in part on expected power (e.g., magnitude) of the data portion and/or sensitivity of subsequent circuitry (e.g., ADC). Additionally, in some embodiments, the controller 36 may control the applied gain by instructing the trans-impedance amplifier 52 to adjust resistance of its feedback resistor 138 (e.g., first feedback resistor 181 and/or second feedback resistor 183), for example, based on a target resistance value.

To facilitate isolating target data, the controller 36 may calibrate the trans-impedance amplifier 52 to control applied filtering (process block 204). Thus, in some embodiments, the controller 36 may determine target filter parameters (e.g., passband, cutoff frequency, and/or filter strength) to be applied by the trans-impedance amplifier 52 based at least in part on target transmission frequency range used to indicate the target data and expected parameters (e.g., frequency and/or power) of electromagnetic interference. In some instances, electromagnetic interference may result from environmental conditions, such as cosmic rays.

Additionally, when a radio frequency system 12 concurrently communicates with multiple communication networks, target data communicated with one communication network may be irrelevant to target data communicated with a different communication network and, thus, considered electromagnetic interference. For example, the controller 36 may facilitate identifying Wi-Fi data from concurrently received Bluetooth data by determining target filter parameters to be applied in the first data path 56A based at least in part on target frequency range used to indicate the Bluetooth data or vice versa. Additionally or alternatively, the controller 36 may facilitate identifying 802.11x data received via the second antenna 34B from LTE data concurrently transmitted via the first antenna 34A by determining target filter parameters to be applied based at least in part on target frequency range and/or target output power used to indicate the LTE data. In fact, in some embodiments, the controller 36 may determine the target filter strength includes second-order filtering when the radio frequency system 12 is concurrently transmitting.

Based at least in part on the target filter parameters, the controller 36 may control filtering to be applied in the controller 36. For example, to control first-order filtering, the controller 36 may instruct the trans-impedance amplifier 52 to adjust resistance of its feedback resistor 138 and/or capacitance of its feedback capacitor 136, for example, based on a target capacitance value. When the target filter parameters indicate that second-order filtering is to be applied, in some embodiments, the controller 36 may instruct the trans-impedance amplifier 52 to supply electrical power to its second-order filter 66B and to close the switching devices 142 coupled between the second-order filter 66B and its voltage amplifier 64. Additionally or alternatively, the controller 36 may instruct the trans-impedance amplifier 52 to adjust capacitance of its input capacitor 132 and/or capacitance of its output capacitor 134, for example, based on corresponding target capacitance values.

To facilitate improving accuracy of the data portion, when direct current offset cancelling circuitry 182 is included, the controller 36 may calibrate the trans-impedance amplifier 52 to compensate for mismatch between a positive direct current offset and a negative direct current offset in its voltage amplifier 64 (process block 206). In some embodiments, the controller 36 may compensate for such mismatches by controlling gate voltage supplied to the third PMOS 184 and/or the fourth PMOS 186 in the direct current offset cancelling circuitry 182. To control applied gate voltage, in some embodiments, the controller 36 may output a control command, which is converted to an analog electrical signal by a digital-to-analog converter and supplied to the gate of the third PMOS 184 and/or the gate of the fourth PMOS 186.

Additionally, based at least in part on current input to a differential input, the voltage amplifier 64 in the trans-impedance amplifier 52 may adjust (e.g., modulate) voltage output from a corresponding differential output (process block 200). For example, the voltage amplifier 64 may adjust voltage output from its positive differential output 174 based at least in part on current supplied to its positive differential input 170. Additionally, the voltage amplifier 64 may adjust voltage output from its negative differential output 176 based at least in part on current supplied to its negative differential input 172. By operating a trans-impedance amplifier 52 in this manner, a corresponding data path 56 through concurrent transceiver front-end circuitry 44 may output one or more voltage modulated processing frequency signals, which may be converted to corresponding digital electrical signals, for example, via an analog-to-digital converter to enable further processing by digital processing circuitry 30.

Accordingly, the technical effects of the techniques described in the present disclosure include improving operational efficiency of a radio frequency system and, thus, an electronic device in which the radio frequency system is implemented. In particular, implementing and operating concurrent transceiver front-end circuitry in the manner described above may enable the radio frequency system to concurrently (e.g., simultaneously) communicate with multiple different communication networks. For example, implementing the concurrent transceiver front-end circuitry with multiple data paths each corresponding with a different communication protocol and a current mode low noise amplifier may facilitate processing of data concurrently received from different communication networks, which at least in some instances may obviate alternation between reception duty cycles. Additionally, implementing the concurrent transceiver front-end circuitry with a trans-impedance that provides tunable first-order filtering and second-order filtering may facilitate isolating target data from electromagnetic interferences including concurrently transmitted data, which at least in some instances may obviate alternation between transmission and reception duty cycles.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. An electronic device comprising a radio frequency system configured to facilitate wireless data communication, wherein the radio frequency system comprises:
   a first antenna configured to generate an analog electrical radio frequency signal based at least in part on received electromagnetic waves; and
   transceiver front-end circuitry comprising a low noise amplifier electrically coupled to the first antenna, wherein the low noise amplifier comprises:
      a positive input transistor, wherein the positive input transistor comprises a first gate electrically coupled to an input node, a first source configured to be electrically coupled to a power source, and a first drain;
      a negative input transistor, wherein the negative input transistor comprises a second gate electrically coupled to the input node, a second source configured to be electrically coupled to ground, and a second drain;
      a first data branch coupled between the first drain and the second drain, wherein the first data branch is configured to supply a first current modulated radio frequency signal generated based at least in part on the analog electrical radio frequency signal to a first output node when the radio frequency system expects the received electromagnetic waves to include data indicated using a first communication protocol; and a second data branch electrically coupled between the first drain and the second drain, wherein the second data branch is configured to supply a second current modulated radio frequency signal generated based at least in part on the analog electrical radio frequency signal to a second output node when the radio frequency system expects the received electromagnetic waves to include data indicated using a second communication protocol.

2. The electronic device of claim 1, wherein:
the positive input transistor comprises a first channel coupled between the first source and the first drain, wherein the positive input transistor is configured to modulate current flow through the first channel based at least in part on positive voltage of the analog electrical radio frequency signal; and
the negative input transistor comprises a second channel coupled between the second source and the second drain, wherein the negative input transistor is configured to modulate current flow through the second channel based at least in part on negative voltage of the analog electrical radio frequency signal.

3. The electronic device of claim 1, wherein:
the first data branch comprises:
a first positive cascode transistor, wherein the first positive cascode transistor comprises a third gate, a third source electrically coupled to the first drain of the positive input transistor, and a third drain electrically coupled to the first output node; and
a first negative cascode transistor, wherein the first negative cascode transistor comprises a fourth gate, a fourth source electrically coupled to the second drain of the negative input transistor, and a fourth drain electrically coupled to the first output node; and
the second data branch comprises:
a second positive cascode transistor, wherein the second positive cascode transistor comprises a fifth gate, a fifth source electrically coupled to the first drain of the positive input transistor, and a fifth drain electrically coupled to the second output node; and
a second negative cascode transistor, wherein the second negative cascode transistor comprises a sixth gate, a sixth source electrically coupled to the second drain of the negative input transistor, and a sixth drain electrically coupled to the second output node.

4. The electronic device of claim 3, wherein the radio frequency system comprises a controller programmed to:
instruct the transceiver front-end circuitry to enable current flow through the first positive cascode transistor and the first negative cascode transistor when the radio frequency system expects the received electromagnetic waves to include data indicated using a Wi-Fi communication protocol; and
instruct the transceiver front-end circuitry to enable current flow through the second positive cascode transistor and the second negative cascode transistor when the radio frequency system expects the received electromagnetic waves to include data indicated using a Bluetooth communication protocol.

5. The electronic device of claim 1, wherein the transceiver front-end circuitry comprises:
a first data path coupled between the first output node of the low noise amplifier and digital processing circuitry, wherein the first data path comprises a first mixer and a first trans-impedance amplifier configured to operate in accordance with the first communication protocol;
a first bypass path electrically between the input node of the transceiver front-end circuitry and the first data path, wherein the first bypass path comprises a first switching device configured to enable bypassing the low noise amplifier when signal power of the analog electrical radio frequency signal output from the first antenna is greater than a signal power threshold and the radio frequency system expects the received electromagnetic waves to include data indicated using the first communication protocol;
a second data path coupled between the second output node of the low noise amplifier and the digital processing circuitry, wherein the second data path comprises a second mixer and a second trans-impedance amplifier configured to operate in accordance with the second communication protocol; and
a second bypass path electrically coupled between the input node of the transceiver front-end circuitry and the second data path, wherein the second bypass path comprises a second switching device configured to enable bypassing the low noise amplifier when the signal power of the analog electrical radio frequency signal output from the first antenna is greater than the signal power threshold and the radio frequency system expects the received electromagnetic waves to include data indicated using the second communication protocol.

6. The electronic device of claim 1, wherein the transceiver front-end circuitry comprises:
a local oscillator configured to generate a first local oscillator signal and a second local oscillator signal one-hundred degrees delayed relative to the first local oscillator signal;
a mixer electrically coupled to the first output node of the low noise amplifier and the first local oscillator, wherein the mixer is configured to, when an input radio frequency signal is received:
generate a positive current modulated processing frequency signal based at least in part on the first local oscillator signal and current of the input radio frequency signal; and
generate a negative current modulated processing frequency signal based at least in part on the second local oscillator signal and current of the input radio frequency signal; and
a trans-impedance amplifier electrically coupled between the mixer and digital processing circuitry, wherein the trans-impedance amplifier is configured to generate a positive voltage modulated processing frequency signal and a negative voltage modulated processing frequency signal based at least in part on the positive current modulated processing frequency signal and the negative current modulated processing frequency signal.

7. The electronic device of claim 1, wherein:
the transceiver front-end circuitry comprises a trans-impedance amplifier electrically coupled between the low noise amplifier and digital processing circuitry; and
the trans-impedance amplifier comprises:
an amplifier core comprising a first pair of differential transistors and a second pair of differential transistors; and
direct current offset cancelling circuitry comprising a third pair of differential transistors electrically coupled to differential output nodes of the trans-impedance amplifier in parallel with the first pair of differential transistors.

8. The electronic device of claim 7, comprising a controller communicatively coupled to the transceiver front-end circuitry, wherein the controller is programmed to:
- determine a positive direct current offset expected to be introduced by the amplifier core;
- determine a negative direct current offset expected to be introduced by the amplifier core; and
- control gate voltage applied to the third pair of differential transistors to offset mismatch between the positive direct current offset and the negative direct current offset, wherein the third pair of differential transistors is a downscaled replica of the first pair of differential transistors.

9. The electronic device of claim 1, wherein:
the transceiver front-end circuitry comprises a trans-impedance amplifier electrically coupled between the low noise amplifier and digital processing circuitry; and
the trans-impedance amplifier comprises:
- a differential amplifier electrically coupled between a second input node of the trans-impedance amplifier and a second output node of the trans-impedance amplifier;
- a first-order filter comprising a feedback resistor and a feedback capacitor electrically coupled in parallel between the second input node and the second output node of the trans-impedance amplifier;
- a first switching device electrically coupled to the second input node of the trans-impedance amplifier;
- a second switching device electrically coupled to the second output node of the trans-impedance amplifier; and
- a second-order filter electrically coupled between the first switching device and the second switching device, wherein the second-order filter comprises a single transconductor.

10. The electronic device of claim 9, comprising a controller communicatively coupled to the transceiver front-end circuitry, wherein the controller is programmed to:
- instruct the first switching device and the second switching device to connect the second-order filter to the differential amplifier when a first-order response produced by the first-order filter is not expected to sufficiently attenuate electromagnetic interference present in the received electromagnetic waves; and
- instruct the first switching device and the second switching device disconnect the second-order filter from the differential amplifier when the first-order response produced by the first-order filter is expected to sufficiently attenuate the electromagnetic interference to facilitate reducing power consumption.

11. The electronic device of claim 10, wherein:
the radio frequency system comprises a second antenna configured to output transmitted electromagnetic waves to facilitate wirelessly communicating data using a third communication protocol; and
the controller is programmed to determine that the first-order response produced by the first-order filter is not expected to sufficiently attenuate the electromagnetic interference when the second antenna is outputting the transmitted electromagnetic waves while the received electromagnetic waves are being received by the first antenna.

12. The electronic device of claim 1, wherein:
the transceiver front-end circuitry comprises a trans-impedance amplifier electrically coupled between the low noise amplifier and digital processing circuitry; and
the trans-impedance amplifier comprises:
- a differential amplifier electrically coupled between a second input node of the trans-impedance amplifier and a second output node of the trans-impedance amplifier;
- a first-order filter comprising a feedback resistor and a feedback capacitor electrically coupled in parallel between the second input node and the second output node of the trans-impedance amplifier;
- an input capacitor electrically coupled between the second input node of the trans-impedance amplifier and ground, wherein the input capacitor is implemented to provide a first adaptively adjustable capacitance; and
- an output capacitor electrically coupled between the second output node of the trans-impedance amplifier and ground, wherein the output capacitor is implemented to provide a second adaptively adjustable capacitance.

13. The electronic device of claim 12, comprising a controller communicatively coupled to the transceiver front-end circuitry, wherein the controller is programmed to:
- instruct the transceiver front-end circuitry to adjust the first adaptively adjustable capacitance of the input capacitor to introduce a second-order response in a transfer function of the trans-impedance amplifier; and
- instruct the transceiver front-end circuitry to adjust the second adaptively adjustable capacitance of the output capacitor to move a first pole in the transfer function, a second pole in the transfer function, or both to enable the second-order response to attenuate frequencies outside a target transmission frequency range quadratically with distance from the target transmission frequency range.

14. The electronic device of claim 13, wherein:
the radio frequency system comprises a second antenna configured to output transmitted electromagnetic waves to facilitate wirelessly communicating data using a third communication protocol; and
the controller is programmed to instruct the transceiver front-end circuitry to adjust the first adaptively adjustable capacitance of the input capacitor, the second adaptively adjustable capacitance of the output capacitor, or both based at least in part on a first transmission frequency range used allocated to the first communication protocol to indicate data, a second transmission frequency range allocated to the second communication protocol to indicate data, a third transmission frequency range allocated to the third communication protocol to indicate data, output power of the transmitted electromagnetic waves, or any combination thereof.

15. A method for operating a radio frequency system, comprising:
determining, using a controller, one or more targeted communication protocols used to indicate data via first electromagnetic waves received by a first antenna of the radio frequency system; and
when the one or more targeted communication protocols comprise a first communication protocol:
- instructing, using the controller, a low noise amplifier in the radio frequency system to route a first current modulated signal generated based at least in part on the first electromagnetic waves to a first mixer;
- instructing, using the controller, the first mixer to bias a first local oscillator signal used by the first mixer to convert the first current modulated signal from a first radio frequency to a processing frequency before supply to a first trans-impedance amplifier; and instructing, using the controller, the first trans-impedance amplifier to adjust capacitance of a first input capacitor, capacitance of a first output capacitor, or both based at least in part on electromagnetic interference expected to be present in the first electromagnetic waves to provide second-order filtering that facilitates subsequent processing of first data indicated by a first voltage modulated signal output from the first trans-impedance amplifier.

16. The method of claim 15, comprising, when the one or more targeted communication protocols comprise a second communication protocol different from the first communication protocol:
   instructing, using the controller, the low noise amplifier in the radio frequency system to route a second current modulated signal generated based at least in part on the first electromagnetic waves to a second mixer;
   instructing, using the controller, the second mixer to bias a second local oscillator signal used by the second mixer to convert the second current modulated signal from a second radio frequency to the processing frequency before supply to a second trans-impedance amplifier; and
   instructing, using the controller, the second trans-impedance amplifier to adjust capacitance of a second input capacitor, capacitance of a second output capacitor, or both based at least in part on the electromagnetic interference expected to be present in the first electromagnetic waves to provide second-order filtering that facilitates subsequent processing of second data indicated by a second voltage modulated signal output from the second trans-impedance amplifier, wherein the second data and the first data are concurrently received via the first electromagnetic waves.

17. The method of claim 15, comprising instructing, using the controller, a second antenna of the radio frequency system to wirelessly transmit second data using a second communication protocol by modulating second electromagnetic waves while the first antenna is receiving the first electromagnetic waves;
   wherein instructing the first trans-impedance amplifier to adjust capacitance of the first input capacitor, capacitance of the first output capacitor, or both comprises instructing the first trans-impedance amplifier to adjust capacitance of the first input capacitor, capacitance of the first output capacitor, or both based at least in part on transmission power of the second electromagnetic waves, transmission frequency of the second electromagnetic waves, or both.

18. A tangible, non-transitory, computer-readable medium that stores instructions executable by one or more processors of a radio frequency system, wherein the instructions comprise instructions to:
   determine, using the one or more processors, a first transmission frequency range allocated to indicate first target data in first electromagnetic waves received by a first antenna of the radio frequency system;
   instruct, using the one or more processors, a first local oscillator in the radio frequency system to generate a first local oscillator signal used to down convert frequency of a first current modulated signal generated based at least in part on the first electromagnetic waves; and
   instruct, using the one or more processors, a first trans-impedance amplifier in the radio frequency system to apply second-order filtering in addition to first-order filtering around the first transmission frequency range to facilitate indicating the first target data via a first voltage modulated signal generated based at least in part on the first current modulated signal when a second antenna of the radio frequency outputs second electromagnetic waves while the first electromagnetic waves are being received by the first antenna.

19. The tangible, non-transitory, computer-readable medium of claim 18, comprising instructions to:
   determine, using the one or more processors, a second transmission frequency range allocated to indicate second target data in the first electromagnetic waves received by the first antenna of the radio frequency system, wherein the second target data and the first target data are indicated using different communication protocols;
   instruct, using the one or more processors, a low noise amplifier in the radio frequency system to route the first current modulated signal to a first data path comprising the first trans-impedance amplifier;
   instruct, using the one or more processors, a low noise amplifier in the radio frequency system to route a second current modulated signal generated based at least in part on the first electromagnetic waves to a second data path comprising a second trans-impedance amplifier; and
   instruct, using the one or more processors, the second trans-impedance amplifier to apply second-order filtering around the second transmission frequency range to facilitate indicating the second target data via a second voltage modulated signal generated based at least in part on the second current modulated signal when the second antenna of the radio frequency system outputs the second electromagnetic waves while the first electromagnetic waves are being received by the first antenna.

20. The tangible, non-transitory, computer-readable medium of claim 18, wherein the instructions to instruct the first trans-impedance amplifier in the radio frequency system to apply second-order filtering comprise instructions to:
   instruct, using the one or more processors, the first trans-impedance amplifier to adjust capacitance of an input capacitor electrically coupled between an input node of the first trans-impedance amplifier and ground to produce a second-order response in a transfer function of the first trans-impedance amplifier; and
   instruct, using the one or more processors, the first trans-impedance amplifier to adjust capacitance of an output capacitor electrically coupled between an output node of the first trans-impedance amplifier and ground to move a first pole in the transfer function and a second pole in the transfer function on top of one another to facilitate attenuating frequencies outside the first transmission frequency range quadratically with distance from the first transmission frequency range.

* * * * *

UNITED STATES PATENT AND TRADEMARK OFFICE
CERTIFICATE OF CORRECTION

PATENT NO. : 10,200,067 B1
APPLICATION NO. : 15/875782
DATED : February 5, 2019
INVENTOR(S) : Ehsan Adabi et al.

Page 1 of 1

It is certified that error appears in the above-identified patent and that said Letters Patent is hereby corrected as shown below:

In the Claims

Claim 6, Column 30, Line 35, delete "first".

Claim 10, Column 31, Line 46, insert --to-- between "device" and "disconnect".

Claim 14, Column 32, Line 44, delete "used".

Claim 18, Column 34, Line 11, insert --system-- between "frequency" and "outputs".

Claim 19, Column 34, Line 27, replace "a" with --the--.

Signed and Sealed this
Twenty-first Day of January, 2020

Andrei Iancu
*Director of the United States Patent and Trademark Office*